United States Patent
Ahn et al.

(10) Patent No.: US 11,332,666 B2
(45) Date of Patent: May 17, 2022

(54) QUANTUM DOTS, COMPOSITIONS AND COMPOSITE INCLUDING THE SAME, AND ELECTRONIC DEVICE INCLUDING THE SAME

(71) Applicant: Samsung Display Co., Ltd., Yongin-si (KR)

(72) Inventors: Jooyeon Ahn, Suwon-si (KR); Jongmin Lee, Hwaseong-si (KR); Taekhoon Kim, Hwaseong-si (KR); Shin Ae Jun, Seongnam-si (KR); Tae Gon Kim, Hwaseong-si (KR); Garam Park, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/036,068

(22) Filed: Sep. 29, 2020

(65) Prior Publication Data
US 2021/0095205 A1 Apr. 1, 2021

(30) Foreign Application Priority Data
Oct. 1, 2019 (KR) .................. 10-2019-0121678

(51) Int. Cl.
*C09K 11/88* (2006.01)
*C09K 11/02* (2006.01)
(Continued)

(52) U.S. Cl.
CPC .......... *C09K 11/883* (2013.01); *C01B 19/007* (2013.01); *C01G 9/006* (2013.01);
(Continued)

(58) Field of Classification Search
CPC . C09K 11/883; C09K 11/025; C09K 11/7492; C09K 11/703; H01L 33/508; B82Y 20/00; B82Y 30/00; B82Y 40/00
See application file for complete search history.

(56) References Cited

U.S. PATENT DOCUMENTS 7,621,997 B2  11/2009  Jun et al.
8,963,119 B2  2/2015  Jang et al.
(Continued)

FOREIGN PATENT DOCUMENTS

CN  105405941 A  3/2016
JP  2012532232 A  12/2012
(Continued)

OTHER PUBLICATIONS

Yongsoo Yang et al., "Deciphering chemical order/disorder and material properties at the single-atom level," Nature, Feb. 2, 2017, pp. 75-79, vol. 542.
(Continued)

*Primary Examiner* — C Melissa Koslow
(74) *Attorney, Agent, or Firm* — Cantor Colburn LLP

(57) ABSTRACT

A quantum dot including a nanoparticle template including a first semiconductor nanocrystal including a Group II-VI compound, a quantum well including a second semiconductor nanocrystal disposed on the nanoparticle template, the second semiconductor nanocrystal including a Group IIIA metal excluding aluminum and a Group V element; and a shell comprising a third semiconductor nanocrystal disposed on the quantum well, the third semiconductor nanocrystal including a Group II-VI compound, wherein the quantum dot does not include cadmium, a band gap energy of the second semiconductor nanocrystal is less than a band gap energy of the first semiconductor nanocrystal, the band gap energy of the second semiconductor nanocrystal is less than a band gap energy of the third semiconductor nanocrystal,
(Continued)

and the quantum dot includes an additional metal including an alkali metal, an alkaline earth metal, aluminum, iron, cobalt, nickel, copper, zinc, or a combination thereof.

23 Claims, 6 Drawing Sheets

(51) Int. Cl.

| | | |
|---|---|---|
| *H01L 51/50* | (2006.01) | |
| *C01G 9/08* | (2006.01) | |
| *C01B 19/00* | (2006.01) | |
| *C01G 9/00* | (2006.01) | |
| *C09K 11/70* | (2006.01) | |
| *C09K 11/74* | (2006.01) | |
| *H01L 33/50* | (2010.01) | |
| *B82Y 30/00* | (2011.01) | |
| *B82Y 40/00* | (2011.01) | |
| *B82Y 20/00* | (2011.01) | |

(52) U.S. Cl.
CPC .............. *C01G 9/08* (2013.01); *C09K 11/025* (2013.01); *C09K 11/703* (2013.01); *C09K 11/7492* (2013.01); *H01L 33/508* (2013.01); *H01L 51/502* (2013.01); *B82Y 20/00* (2013.01); *B82Y 30/00* (2013.01); *B82Y 40/00* (2013.01); *C01P 2002/20* (2013.01); *C01P 2002/84* (2013.01); *C01P 2004/64* (2013.01); *C01P 2006/60* (2013.01)

(56) References Cited

U.S. PATENT DOCUMENTS

| | | | |
|---|---|---|---|
| 9,260,652 B2 | 2/2016 | Peng et al. | |
| 9,834,724 B2 * | 12/2017 | Kim | .................. C09K 11/565 |
| 9,853,190 B2 * | 12/2017 | Glarvey | .................. C09K 11/64 |
| 10,162,259 B2 * | 12/2018 | Nam | .................... G03F 7/0007 |
| 10,424,695 B2 | 9/2019 | Won et al. | |
| 2008/0305334 A1 | 12/2008 | Jang et al. | |
| 2017/0162764 A1 | 6/2017 | Kan et al. | |
| 2018/0094190 A1 | 4/2018 | Kim et al. | |
| 2019/0055465 A1 * | 2/2019 | Park | ..................... C08F 220/06 |
| 2019/0378959 A1 | 12/2019 | Won et al. | |

FOREIGN PATENT DOCUMENTS

| | | |
|---|---|---|
| KR | 20070029915 A | 3/2007 |
| KR | 20080107578 A | 12/2008 |
| KR | 20110140049 A | 12/2011 |
| KR | 20150034621 A | 4/2015 |
| KR | 1525524 B | 6/2015 |
| KR | 20170007668 A | 1/2017 |
| KR | 20180068893 A | 6/2018 |

OTHER PUBLICATIONS

David A Browne et al., "Electron transport in unipolar InGaN/GaN multiple quantum well structures grown by NH3 molecular beam epitaxy," Journal of Applied Physics, May 8, 2015, pp. 185703-1-185703-9, vol. 117.

Nathalie Claes et al., "Characterization of Janus gold nanoparticles obtained via spontaneous binary polymer shell segregation," European Microscopy Congress 2016: Proceedings, Materials Science, Complex materials and nanocomposites, Dec. 20, 2016, pp. 690-691.

Sungwoo Kim et al., "Reverse Type-I ZnSe/InP/ZnS Core/Shell/Shell Nanocrystals: Cadmium-Free Quantum Dots for Visible Luminescence," communications, Quantum Dots, Dec. 3, 2010, pp. 70-73, vol. 7, Issue No. 1.

Wikipedia, Atom-probe, Sep. 29, 2020, (https://en.wikipedia.org/wiki/Atom_probe).

* cited by examiner

QUANTUM DOTS, COMPOSITIONS AND COMPOSITE INCLUDING THE SAME, AND ELECTRONIC DEVICE INCLUDING THE SAME

CROSS-REFERENCE TO RELATED APPLICATION

This application claims priority to and the benefit of Korean Patent Application No. 10-2019-0121678 filed in the Korean Intellectual Property Office on Oct. 1, 2019, and all the benefits accruing therefrom under 35 U.S.C. § 119, the content of which in its entirety is herein incorporated by reference.

BACKGROUND

1. Field

Quantum dots, compositions, and composites including the same, and an electronic device (e.g., a display device) including the same are disclosed.

2. Description of the Related Art

Physical characteristics (e.g., band gap energies, melting points, etc.) of nanoparticles that are intrinsic characteristics may be controlled by changing particle sizes of the nanoparticles, unlike bulk materials. For example, semiconductor nanocrystal particles also referred to as quantum dots are a crystalline material having a size of several nanometers. Such semiconductor nanocrystal particles may have such a small size that the semiconductor nanocrystal particles may have a large surface area per unit volume and exhibit quantum confinement effects, and thus have different properties from the characteristics of bulk materials having the same composition. Quantum dots may absorb light from an excitation source to be excited, and may emit energy corresponding to band gap energies of the quantum dots.

SUMMARY

An embodiment provides a composition including cadmium-free quantum dots capable of exhibiting improved luminescence properties (such as blue light absorption rate).

An embodiment is for a quantum dot-polymer composite including the cadmium-free quantum dots.

An embodiment provides a stacked structure and an electronic device (e.g., a display device) including the quantum dot-polymer composite.

An embodiment provides the cadmium-free quantum dots.

In an embodiment, a quantum dot includes a nanoparticle template including a first semiconductor nanocrystal including a Group II-VI compound, a quantum well including a second semiconductor nanocrystal disposed on the nanoparticle template, the second semiconductor nanocrystal including a Group IIIA metal excluding aluminum, and a Group V element, and a shell including a third semiconductor nanocrystal disposed on the quantum well, the third semiconductor nanocrystal including a Group II-VI compound, wherein the quantum dot does not include cadmium, a band gap energy of the second semiconductor nanocrystal is less than a band gap energy of the first semiconductor nanocrystal and a band gap energy of the third semiconductor nanocrystal, and the quantum dot includes an additional metal including an alkali metal, an alkaline earth metal, aluminum, iron, cobalt, nickel, copper, zinc, or a combination thereof.

The additional metal may include lithium, sodium, aluminum, or a combination thereof.

The additional metal may include magnesium.

A mole ratio of the additional metal with respect to the Group IIIA metal may be greater than or equal to about 0.001:1.

The mole ratio of the additional metal with respect to the Group IIIA metal may be greater than or equal to about 0.01:1.

The mole ratio of the additional metal with respect to the Group IIIA metal may be less than or equal to about 1:1.

The mole ratio of the additional metal with respect to the Group IIIA metal may be less than or equal to about 0.5:1.

The mole ratio of the additional metal with respect to the Group IIIA metal may be less than or equal to about 0.2:1.

The quantum dot may further include a halogen. The halogen may include chlorine, bromine, iodine, fluorine, or a combination thereof. The halogen may include fluorine, chlorine, or a combination thereof.

The Group II-VI compound in the first semiconductor nanocrystal may include a zinc chalcogenide, and the Group II-VI compound in the third semiconductor nanocrystal may include a zinc chalcogenide.

A composition of the first semiconductor nanocrystal may be different than a composition of the third semiconductor nanocrystal.

The first semiconductor nanocrystal and the third semiconductor nanocrystal may have the same composition.

The first semiconductor nanocrystal may include ZnSe, ZnTeSe, ZnSeS, ZnS, or a combination thereof.

The third semiconductor nanocrystal may include ZnSe, ZnSeS, ZnS, or a combination thereof.

The quantum well may include indium and phosphorus.

The additional metal and the halogen may be present an interface between the nanoparticle template and the quantum well, inside the quantum well, an interface between the quantum well and the shell, or a combination thereof.

An ultraviolet-visible (UV-Vis) absorption spectrum curve of the quantum dot may not have an inflection point within a wavelength range of about 450 nanometers (nm) to about 620 nm.

In the quantum dot, a total mole amount of indium and phosphorus may be less than about 20%, based on a total number of moles in the quantum dot (e.g., when confirmed in an inductively coupled plasma analysis).

The nanoparticle template may include zinc and selenium.

The shell may include zinc, selenium, and sulfur.

In the quantum dot, a mole ratio (Zn:(Se+S)) of zinc with respect to a total sum of selenium and sulfur may be greater than or equal to about 1:1.

The quantum well may include a plurality of layers, and a composition of a first layer among the plurality of layers may be different than a composition of a second layer among the plurality of layers, the first layer being adjacent to the second layer.

The layer adjacent to the nanoparticle template among the plurality of layers may include zinc phosphide, zinc indium phosphide, aluminum phosphorus oxide, or a combination thereof.

A layer adjacent to the shell among the plurality of layers may include indium phosphide.

The quantum dot may include an organic ligand on a surface of the quantum dot, wherein the organic ligand may include RCOOH, RCOOCOR, $RNH_2$, $R_2NH$, $R_3N$, RSH, R₃PO, R₃P, ROH, RCOOR', RPO(OH)₂, R₂POOH, or a combination thereof, wherein R and R' are each independently a substituted or substituted C1 to C30 aliphatic hydrocarbon group, a substituted or unsubstituted C6 to C30 aromatic hydrocarbon group, or a combination thereof.

The quantum dot may exhibit increased quantum efficiency (QY) and an emission wavelength that is shifted toward a shorter wavelength in comparison with a quantum dot that includes the same nanoparticle template, the same quantum well, and the same shell, but does not include the additional metal or the halogen.

The quantum dot may emit green light, and a UV-Vis absorption spectrum curve of the quantum dot may not have an inflection point within a wavelength range of about 450 nm to about 540 nm.

The quantum dot may emit red light and a UV-Vis absorption spectrum curve of the quantum dot may not have an inflection point within a wavelength range of about 550 nm to about 620 nm.

In an embodiment, a quantum dot includes a nanoparticle template including a first semiconductor nanocrystal including a Group II-VI compound, a quantum well including a second semiconductor nanocrystal disposed on the nanoparticle template, the second semiconductor nanocrystal including a Group IIIA metal excluding aluminum and a Group V element and a third semiconductor nanocrystal disposed on the quantum well, the third semiconductor nanocrystal including a Group II-VI compound, the quantum dot does not include cadmium, a band gap energy of the second semiconductor nanocrystal is less than a band gap energy of the first semiconductor nanocrystal, the band gap energy of the second semiconductor nanocrystal is less than a band gap energy of the third semiconductor nanocrystal, the quantum dot emits green light, and a UV-Vis absorption spectrum curve of the quantum dot does not have an inflection point in a wavelength range of greater than or equal to about 400 nm (or, greater than or equal to about 420 nm, greater than or equal to about 440 nm, greater than or equal to about 450 nm, or greater than or equal to about 460 nm) and less than or equal to about 500 nm (or less than or equal to about 490 nm).

The quantum dot may further include the additional metal, the halogen, or a combination thereof.

In the quantum dot, a mole ratio of phosphorus with respect to Group IIIA metal may be less than or equal to about 0.9:1, less than or equal to about 0.8:1, less than or equal to about 0.7:1, or less than or equal to about 0.6:1. In the quantum dot, the mole ratio of phosphorus with respect to Group IIIA metal may be greater than or equal to about 0.4:1, greater than or equal to about 0.5:1, or greater than or equal to about 0.55:1.

In an embodiment, a composition may include the quantum dot, a dispersing agent, a polymerizable monomer including a carbon-carbon unsaturated bond, an initiator, and a solvent.

The dispersing agent may be a polymer including a carboxylic acid group.

The polymer including a carboxylic acid group may include a copolymer of a monomer combination including a first monomer including a carboxylic acid group and a carbon-carbon double bond, a second monomer having a carbon-carbon double bond and a hydrophobic moiety, and not including a carboxylic acid group, and optionally a third monomer including a carbon-carbon double bond and a hydrophilic moiety and not including a carboxylic acid group, a polymer including a multi-aromatic ring including a carboxylic acid group (—COOH) and having a backbone structure in which two aromatic rings in the main chain are bonded to a quaternary carbon atom that is a constituent atom of another cyclic moiety; or a combination thereof.

The composition may further include a multi-thiol compound having at least two thiol groups at a terminal end of the multi-thiol compound, metal oxide particulates, or a combination thereof.

In an embodiment, the patterned film includes a repeating section configured to emit light of a predetermined wavelength, the repeating sections including a quantum dot polymer composite, the quantum dot-polymer composite including a polymer matrix and the aforementioned quantum dots dispersed in the polymer matrix.

The repeating section may include a first section configured to emit red light.

The repeating sections may include a second section configured to emit green light.

The repeating sections may include a first section configured to emit red light and a second section configured to emit green light.

In an embodiment, a display device includes a light source; and a photoluminescent element, wherein the photoluminescent element includes a substrate, and the patterned film disposed on a surface of the substrate, and the light source is configured to provide the photoluminescent element with incident light.

The incident light may have a peak wavelength within a range of about 440 nm to about 460 nm.

A quantum dot according to an embodiment may exhibit improved luminescence properties (e.g., improved blue light absorption rate). The quantum dot may be used in various display devices and biological labeling (e.g., biosensors or bio-imaging), photodetectors, solar cells, hybrid composites, and the like.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
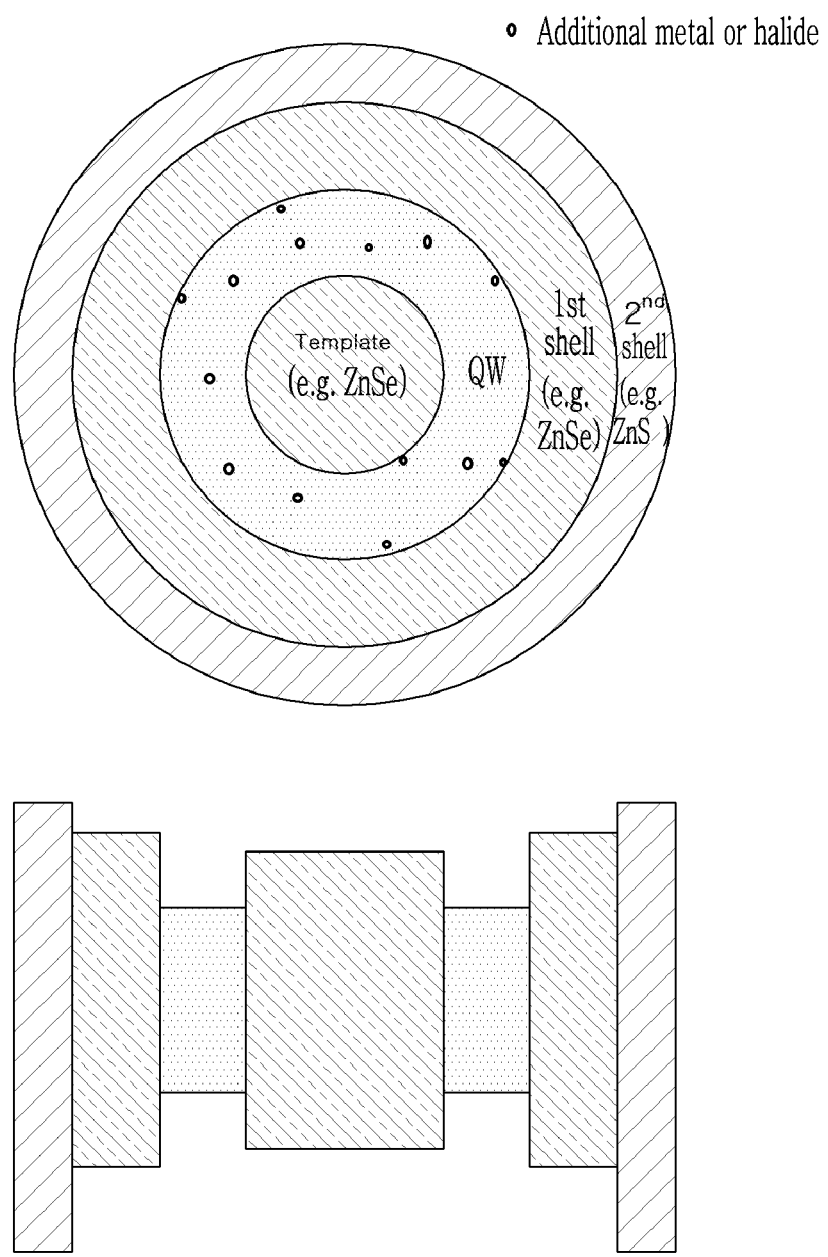
FIG. 1 is a schematic cross-sectional view of a quantum dot according to an embodiment.

Advantages and characteristics of this disclosure, and a method for achieving the same, will become evident referring to the following example embodiments together with the drawings attached hereto.

However, the embodiments should not be construed as being limited to the embodiments set forth herein. If not defined otherwise, all terms (including technical and scientific terms) in the specification may be defined as commonly understood by one skilled in the art. The terms defined in a generally-used dictionary may not be interpreted ideally or exaggeratedly unless clearly defined. In addition, unless explicitly described to the contrary, the word "comprise" and variations such as "comprises" or "comprising", will be understood to imply the inclusion of stated elements but not the exclusion of any other elements.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

Further, the singular includes the plural unless mentioned otherwise. For example, a quantum dot or a nanocrystal particle may also refer to quantum dots or nanocrystalline particles.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer, or section from another element, component, region, layer, or section. Thus, "a first element," "component," "region," "layer" or "section" discussed below could be termed a second element, component, region, layer, or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, when a definition is not otherwise provided, "substituted" refers to a compound wherein hydrogen is replaced by a substituent selected from a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, halogen (—F, —Cl, —Br, or —I), a hydroxy group (—OH), a nitro group (—NO$_2$), a cyano group (—CN), an amine or amino group (—NRR', wherein R and R' are independently hydrogen or a C1 to C6 alkyl group), an azido group (—N$_3$), an amidino group (—C(=NH)NH$_2$)), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxyl group (—OOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

As used herein, when a definition is not otherwise provided, "hetero" refers to one including 1 to 3 heteroatoms selected from N, O, S, Si, and P.

As used herein, when a definition is not otherwise provided, "alkylene group" refers to a straight or branched saturated aliphatic hydrocarbon group having at least two valences and optionally substituted with at least one substituent.

As used herein, when a definition is not otherwise provided, "arylene group" refers to a functional group having at least two valences obtained by removal of at least two hydrogens in at least one aromatic ring, and optionally substituted with at least one substituent.

As used herein, when a definition is not otherwise provided, "aliphatic hydrocarbon group" refers to a C1 to C30 linear or branch alkyl group, "aromatic hydrocarbon group" refers to a C6 to C30 aryl group or a C2 to C30 heteroaryl group, and "alicyclic hydrocarbon group" refers to a C3 to C30 cycloalkyl group, a C3 to C30 cycloalkenyl group, and a C3 to C30 cycloalkynyl group.

As used herein, when a definition is not otherwise provided, "(meth)acrylate" refers to acrylate, methacrylate, or a combination thereof.

As used herein, "hydrophobic moiety" refers to a moiety that may cause the compound to tend to aggregate in aqueous solution and exclude water. For example, the hydrophobic moiety may include C2 or more aliphatic hydrocarbon group (alkyl, alkenyl, alkynyl, etc.), C6 or more aromatic hydrocarbon group (phenyl, naphthyl, aralkyl group, etc.), or C5 or more alicyclic hydrocarbon group (cyclohexyl, norbornenyl, norbornanyl, tricyclodecyl, etc.). In an embodiment, the hydrophobic moiety may be virtually lacking in ability to form hydrogen bonds with the surrounding medium, or may not be mixed due to mismatch of polarity.

As used herein, "dispersion" refers to a dispersion in which a dispersed phase is a solid, and a continuous medium includes a liquid or a solid. In an embodiment, the dispersed phase has a dimension of greater than or equal to about 1 nm, for example, greater than or equal to about 2 nm, greater than or equal to about 3 nm, or greater than or equal to about 4 nm and several micrometers (μm) or less (for example, less than or equal to about 2 μm, or less than or equal to about 1 μm or less).

As used herein, "Group" refers to a group of Periodic Table.

As used herein, "Group I" refers to Group IA and Group IB, and examples thereof may include Li, Na, K, Rb, and Cs, but are not limited thereto.

As used herein, "Group II" refers to Group IIA and Group IIB, and examples of Group II metal may be Cd, Zn, Hg, and Mg, but are not limited thereto.

As used herein, "Group III" refers to Group IIIA and Group IIIB, and examples of Group III metal may be Al, In, Ga, and TI, but are not limited thereto.

As used herein, "Group IV" refers to Group IVA and Group IVB, and examples of a Group IV metal may be Si, Ge, and Sn, but are not limited thereto. As used herein, the term "metal" may include a semi-metal such as Si.

As used herein, "Group V" refers to Group VA, and examples thereof may include nitrogen, phosphorus, arsenic, antimony, and bismuth, but are not limited thereto.

As used herein, "Group VI" refers to Group VIA, and examples thereof may include sulfur, selenium, and tellurium, but are not limited thereto.

As used herein, the expression "not including cadmium (or other harmful heavy metal)" refers to the case where a concentration of cadmium (or other harmful heavy metal) may be less than or equal to about 100 parts per million (ppm), for example, parts per million by mole, less than or equal to about 50 ppm, less than or equal to about 10 ppm, or almost zero. In an embodiment, substantially no amount of cadmium (or other harmful heavy metal) may be present or, if present, an amount of cadmium (or other harmful heavy metal) may be less than or equal to a detection limit or as an impurity level of a given analysis tool (e.g., an inductively coupled plasma atomic emission spectroscopy). Semiconductor nanocrystal particles, also referred to as quantum dots, are nanoscale-sized (e.g., colloidal) crystalline semiconductor materials, having a large surface area per unit volume and exhibiting quantum confinement effects. A quantum dot may absorb light from an excitation source to become excited, e.g., move or jump to an energy excited state, and emit energy corresponding to a band gap energy of the quantum dot.

Due to unique light emission characteristics, quantum dots have application potential in various electronic devices (e.g., a display device). Quantum dots having physical properties applicable to a display device may be cadmium-based quantum dots. However, cadmium may cause a serious environment/health problem and thus is a restricted element. An example of cadmium-free quantum dots (hereinafter, cadmium-free quantum dots) is a Group III-V based nanocrystal. Cadmium-free quantum dots may have poor luminescence properties (e.g., blue light absorption rate) and stability compared with cadmium-based quantum dots. Blue light (e.g., 450 nm wavelength) may be used as an energy excitation source for the quantum dots. Cadmium-based quantum dot may have a high absorption intensity for blue light, but in the case of a cadmium-free quantum dot, the absorption intensity in blue light (e.g., a wavelength of 450 nm) is not high, which may lead to decreased luminance in the display device.

Since polarized light passed through a liquid crystal expresses a color while passing, e.g., passing through, an absorption type color filter, a liquid crystal display (hereinafter, LCD) may have problems in that luminance may be deteriorated due to a narrow viewing angle and a low light transmittance of an absorption type color filter. A photoluminescent type color filter is an alternative to overcome the technical limits of a display device including an absorption type color filter. A quantum dot-based color filter may use blue light instead of white light as an excitation light, and a color filter may be disposed in front of the device to convert the excitation light to the desirable light (e.g., green light/red light). Thereby, a quantum dot-based color filter may solve the fundamental technical problems of the liquid crystal display (e.g., narrow viewing angle and considerable light loss). For example, a viewing angle problem may be solved since light having linearity may be scattered in all directions while passing, e.g., passing through, a liquid crystal layer, and light loss that may occur in, e.g., with, an absorption type color filter may be decreased or prevented.

However, when employing a quantum dot-based color filter, excitation light propagating toward the front side of the device may cause a serious defect, and thus may be required to be blocked. Cadmium-free quantum dots may not provide an absorption rate sufficient to address this problem.

In order to improve absorption rates, a light scattering body may be introduced. However, introduction of a light scattering body may lead to an increase in a production cost. Since a light scattering body may have a high external light reflectance, an increase in use of a light scattering body may lead to an increase in external light reflection, and may provide additional difficulties in a process due to an increase of solid contents. A blue light filter may block excitation light, which may cause an increase in production cost and an increase in reflection due to external light and may lead to optical loss and a decrease in contrast and clearness of a display device.

A quantum dot according to an embodiment may exhibit an increased absorption rate of blue light while not including cadmium by having a configuration described herein, and may solve the aforementioned problems. A quantum dot having an increased excitation light absorption rate according to an embodiment may suppress a blue light leakage phenomenon without using a decreased amount of a light scattering body, without using a blue blocking filter, or a combination thereof.

In an embodiment, the quantum dot includes a template, e.g., a nanoparticle template, including a first semiconductor nanocrystal including a Group II-VI compound, a quantum well including a second semiconductor nanocrystal surrounding the template and including a Group IIIA metal excluding aluminum and a Group V element, and a shell disposed on the quantum well and including a third semiconductor nanocrystal including a Group II-VI compound. In an embodiment, the quantum dot does not include cadmium.

A band gap energy of the second semiconductor nanocrystal is less than a band gap energy of the first semiconductor nanocrystal and a band gap energy of the third semiconductor nanocrystal. For example, referring to FIG. 1, in an energy band alignment, a valence band edge and a conduction band edge of the second semiconductor nanocrystal may be within a band gap of the first semiconductor nanocrystal. The valence band edge and the conduction band edge of the second semiconductor nanocrystal may be within a band gap of the third semiconductor nanocrystal.

The Group II-VI compound included in the first semiconductor nanocrystal and the third semiconductor nanocrystal may include a zinc chalcogenide. The first semiconductor nanocrystal and the third semiconductor nanocrystal may have a different composition from, e.g., than, one another. The first semiconductor nanocrystal and the third semiconductor nanocrystal may have the same composition.

The band gap energy of the first semiconductor nanocrystal and the band gap energy of the third semiconductor nanocrystal may be the same or different. In an embodiment, the band gap energy of the first semiconductor nanocrystal may be greater than the band gap energy of the third semiconductor nanocrystal. In an embodiment, the band gap energy of the first semiconductor nanocrystal may be less than the band gap energy of the third semiconductor nanocrystal.

The zinc chalcogenide is a compound including a zinc metal and a chalcogen element (e.g., selenium, tellurium, sulfur, or a combination thereof). The zinc chalcogenide may include ZnSe, ZnTeSe, ZnSeS, ZnS, ZnSTe, or a combination thereof.

The first semiconductor nanocrystal may include ZnSe, ZnTeSe, ZnSeS, ZnS, or a combination thereof. The third semiconductor nanocrystal may include ZnSe, ZnSeS, ZnS, or a combination thereof. In an embodiment, the template may include zinc and selenium, sulfur, or a combination thereof. The template may not include sulfur. The template may not include selenium. The template may include zinc, selenium, and sulfur. The template may further include tellurium, as desired.

In an embodiment, the shell may include zinc and sulfur. The shell may further include selenium. The template may include zinc and selenium, and the shell may include zinc, selenium, and sulfur. In an embodiment, the quantum well may include indium and phosphorus. The quantum well may include indium phosphide.

The shell may include a plurality of layers, and adjacent layers of the plurality of layers may have a different composition from one another. The layer adjacent to, e.g., directly on, the template of the plurality of layers may include ZnSe, ZnSeS, or a combination thereof. A layer adjacent to the template of the plurality of layers may not include sulfur. A layer that is not adjacent to the template of the plurality of layers (e.g., the outermost shell layer of quantum dots) may include ZnS, ZnSeS, or a combination thereof. The layer that is not adjacent to the template may not include selenium.

In an embodiment, the quantum dot may further include an additional metal that is not included in the first semiconductor nanocrystal, the second semiconductor nanocrystal, the third semiconductor nanocrystal, or a combination thereof. In an embodiment, the quantum dot may further include a halogen (e.g., halogen ions). The additional metal, the halogen, or a combination thereof may be included, for example, at the quantum well (layer), at the interface of the quantum well and adjacent layers, or a combination thereof. The additional metal may include an alkali metal, an alkaline-earth metal, aluminum, iron, cobalt, nickel, copper, zinc, or a combination thereof. In an embodiment, the additional metal may be lithium, sodium, magnesium, aluminum, or a combination thereof.

The halogen may be fluorine, chlorine, bromine, iodine, or a combination thereof.

The additional metal may be included in an amount of greater than or equal to about 0.1 moles (mole), greater than or equal to about 0.2 mole, greater than or equal to about 0.3 mole, greater than or equal to about 0.4 mole, greater than or equal to about 0.5 mole, greater than or equal to about 0.6 mole, greater than or equal to about 0.7 mole, greater than or equal to about 0.8 mole, greater than or equal to about 0.9 mole, greater than or equal to about 1 mole, greater than or equal to about 1.5 mole, greater than or equal to about 2 mole, greater than or equal to about 2.5 mole, greater than or equal to about 3 mole, greater than or equal to about 4 mole, greater than or equal to about 5 mole, greater than or equal to about 6 mole, greater than or equal to about 7 mole, greater than or equal to about 8 mole, greater than or equal to about 9 mole, greater than or equal to about 10 mole, greater than or equal to about 11 mole, greater than or equal to about 12 mole, greater than or equal to about 13 mole, greater than or equal to about 14 mole, or greater than or equal to about 15 mole, per 100 mole of Group IIIA metal included in the quantum dots (e.g., when analyzed by inductively coupled plasma spectroscopy). The amount of the additional metal as included may be less than or equal to about 100 moles, less than or equal to about 90 mole, less than or equal to about 70 moles, less than or equal to about 50 mole, less than or equal to about 20 mole, less than or equal to about 19 mole, less than or equal to about 18 mole, less than or equal to about 17 mole, less than or equal to about 16 mole, less than or equal to about 15 mole, less than or equal to about 14 mole, less than or equal to about 13 mole, less than or equal to about 12 mole, less than or equal to about 11 mole, less than or equal to about 10 mole, less than or equal to about 9 mole, less than or equal to about 8 mole, less than or equal to about 7 mole, less than or equal to about 6 mole, or less than or equal to about 5 mole (e.g., when analyzed by inductively coupled plasma spectroscopy).

In the quantum dots, when analyzed by ion chromatography, an amount of the additional metal may be greater than or equal to about 0.1 ppm, e.g., parts per million by mole, for example, greater than or equal to about 1 ppm, greater than or equal to about 2 ppm, greater than or equal to about 3 ppm, greater than or equal to about 4 ppm, greater than or equal to about 5 ppm, greater than or equal to about 6 ppm, greater than or equal to about 7 ppm, greater than or equal to about 8 ppm, greater than or equal to about 9 ppm, greater than or equal to about 10 ppm, greater than or equal to about 11 ppm, or greater than or equal to about 12 ppm. The ion chromatography analysis may include extracting predetermined quantum dots dispersion with deionized water. In an embodiment, quantum dot dispersion including a predetermined amount of quantum dots is extracted with deionized water.

In the quantum dots, for example, as determined by (high concentration) inductively coupled plasma spectroscopy, a mole ratio of the additional metal with respect to Group IIIA metal may be greater than or equal to about 0.0001:1, greater than or equal to about 0.0005:1, greater than or equal to about 0.001:1, greater than or equal to about 0.005:1, greater than or equal to about 0.009:1, greater than or equal to about 0.01:1, greater than or equal to about 0.015:1, or greater than or equal to about 0.02:1. The mole ratio of the additional metal with respect to Group IIIA metal may be less than or equal to about 1:1, for example, less than or equal to about 0.9:1, less than or equal to about 0.8:1, less than or equal to about 0.7:1, less than or equal to about 0.6:1, less than or equal to about 0.5:1, less than or equal to about 0.4:1, less than or equal to about 0.3:1, less than or equal to about 0.2:1, less than or equal to about 0.1:1, less than or equal to about 0.09:1, less than or equal to about 0.08:1, less than or equal to about 0.07:1, less than or equal to about 0.06:1, or less than or equal to about 0.05:1.

The quantum dots may further include a halogen. The halogen may be included in an amount of greater than or equal to about 0.01 mole, for example, greater than or equal to about 0.02 mole, greater than or equal to about 0.05 mole, greater than or equal to about 0.1 mole, greater than or equal to about 0.5 mole, greater than or equal to about 1 mole, greater than or equal to about 2 mole, greater than or equal to about 3 mole, greater than or equal to about 4 mole, greater than or equal to about 5 mole, greater than or equal to about 6 mole, greater than or equal to about 7 mole, greater than or equal to about 8 mole, greater than or equal to about 9 mole, greater than or equal to about 10 mole, greater than or equal to about 11 mole, greater than or equal to about 12 mole, greater than or equal to about 13 mole, greater than or equal to about 14 mole, or greater than or equal to about 15 mole, per 100 mole of the Group IIIA metal included in the quantum dots.

The halogen may be included in an amount of less than or equal to about mole, less than or equal to about 10 mole, less than or equal to about 9 mole, less than or equal to about 8 mole, less than or equal to about 7 mole, less than or equal to about 6 mole, less than or equal to about 5 mole, less than or equal to about 4 mole, less than or equal to about 3 mole, less than or equal to about 2 mole, less than or equal to about 1 mole, less than or equal to about 0.1 mole, or less than or equal to about 0.05 mole, per 100 mole of the Group IIIA metal included in the quantum dots.

In the quantum dots, when analyzed by ion chromatography, an amount of halogen may be greater than or equal to about 0.1 ppm, e.g., parts per million by mole, greater than or equal to about 0.5 ppm, greater than or equal to about 1 ppm, greater than or equal to about 2 ppm, greater than or equal to about 5 ppm, greater than or equal to about 10 ppm, or greater than or equal to about 12 ppm.

The colloidal semiconductor nanocrystal particle (hereinafter, also referred to as a quantum well quantum dot) having a structure in which the quantum well is used as a light emitting layer (hereinafter, referred to quantum well structure) may exhibit an improved blue absorption rate, compared to a core-shell quantum dot having a light emitting core having the same composition as the quantum well. While not wanting to be bound by theory, it is understood that the quantum well in the quantum well structure may have an increased volume greater than that of the light emitting core of the core shell quantum dot, and it is estimated that the light absorption, e.g., light absorption rate, is improved by the volume increase. Quantum well quantum dots may have an interface area between different compositions that is greater than that of core-shell quantum dots having the same composition, defects may be more easily generated upon forming the quantum well (layer), and uniform growth may be difficult. According to quantum dots of an embodiment, the problems may be addressed by introducing the aforementioned additional metal and halogen (e.g., as a form of an additional metal-halide) during forming Groups III-V semiconductor nanocrystal (e.g., after initiating the forming and before forming the additional shell) upon forming the quantum well (layer).

Accordingly, quantum dots according to an embodiment may have increased quantum efficiency compared with quantum dots including the template and the quantum well and the shell but not including the additional metal and halogen. The quantum dots may have quantum efficiency of greater than or equal to about 5%, greater than or equal to about 10%, greater than or equal to about 15%, greater than or equal to about 20%, greater than or equal to about 25%, greater than or equal to about 30%, greater than or equal to about 40%, greater than or equal to about 50%, greater than or equal to about 60%, or greater than or equal to about 70%.

A quantum dot according to an embodiment may exhibit an emission wavelength that is shifted toward a shorter wavelength (e.g., blue-shifted) in comparison with a quantum dot including the same template and the same quantum well and the same shell but not including the additional metal and/or halogen. The emission wavelength of the quantum dot of an embodiment may be shifted toward a shorter wavelength by greater than or equal to about 1 nm, greater than or equal to about 2 nm, greater than or equal to about 3 nm, greater than or equal to about 4 nm, greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 11 nm, greater than or equal to about 12 nm, greater than or equal to about 13 nm, greater than or equal to about 14 nm, or greater than or equal to about 15 nm, compared with quantum dots not including the additional metal and halogen. While not wanting to be bound by theory, it is understood that the additional metal, for example, together with halogen, may confer the light emitting layer (e.g., indium phosphide layer) on the template with a more uniform shape. The blue shift may imply binding of the template with the light emitting layer.

Quantum dots of an embodiment may have a full width at half maximum (FWHM) of less than or equal to about 100 nm, for example, less than or equal to about 80 nm, less than or equal to about 70 nm, less than or equal to about 60 nm, less than or equal to about 50 nm, less than or equal to about 40 nm, or less than or equal to about 35 nm.

In quantum dots of an embodiment, the additional metal and halogen may be included at the interface between the template and the quantum well, inside the quantum well, at the interface between the quantum well and the shell, or a combination thereof.

A quantum dot according to an embodiment, while emitting a green light or red light, may have a total mole amount of the Group IIIA metal (e.g., indium) and the Group V element (e.g., phosphorus), (as identified by appropriate analytical means) that is less than or equal to about 20%, less than or equal to about 19%, less than or equal to about 18%, less than or equal to about 17%, less than or equal to about 16%, less than or equal to about 15%, less than or equal to about 14%, less than or equal to about 13%, less than or equal to about 12%, less than or equal to about 11%, less than or equal to about 10%, less than or equal to about 9%, less than or equal to about 8%, less than or equal to about 7%, less than or equal to about 6%, less than or equal to about 5%, less than or equal to about 4%, or less than or equal to about 3%, based on the total number of moles of all elements of the entire quantum dots. The total mole amount of indium and phosphorus may be greater than or equal to about 0.01%, greater than or equal to about 0.05%, greater than or equal to about 0.1%, greater than or equal to about 0.2%, greater than or equal to about 0.3%, greater than or equal to about 0.4%, greater than or equal to about 0.5%, greater than or equal to about 0.6%, greater than or equal to about 0.7%, greater than or equal to about 0.8%, greater than or equal to about 0.9%, or greater than or equal to about 1%, based on the total number of moles of all elements of the quantum dot.

In the quantum dots, a mole ratio of the Group II metal (e.g., zinc) to the Group IIIA metal (e.g., indium) may be greater than or equal to about 7:1, greater than or equal to about 9:1, greater than or equal to about 10:1, greater than or equal to about 13:1, greater than or equal to about 15:1, greater than or equal to about 18:1, greater than or equal to about 20:1, greater than or equal to about 22:1, greater than or equal to about 23:1, greater than or equal to about 24:1, greater than or equal to about 25:1, greater than or equal to about 26:1, greater than or equal to about 27:1, greater than or equal to about 28:1, greater than or equal to about 29:1, or greater than or equal to about 30:1. In the quantum dots, a mole ratio of the Group II metal (e.g., zinc) to the Group IIIA metal (e.g., indium) may be less than or equal to about 50:1, less than or equal to about 45:1, less than or equal to about 40:1, or less than or equal to about 35:1.

The content of each component of the quantum dots may be confirmed by inductively coupled plasma (ICP) analysis, X-ray photoelectron spectroscopy (XPS), ion chromatography (IC), or other appropriate means.

Hereinafter, in the description for a composition of the quantum dot, indium as an example of a Group IIIA metal except for aluminum, phosphorus as an example of a Group V element, zinc as an example of a Group II metal included in a Group II-VI compound (for example, included in the template), and selenium as an example of a Group VI element are exemplified, but a composition of the quantum dot is not limited thereto. As used herein, a ratio (e.g., having a relation with the composition of the quantum dot) means a mole ratio unless otherwise indicated.

In the quantum dots, a mole ratio of the Group V element (e.g., phosphorus) to the Group IIIA metal (e.g., indium) may be greater than or equal to about 0.2:1, for example, greater than or equal to about 0.3:1, greater than or equal to about 0.4:1, greater than or equal to about 0.5:1, greater than or equal to about 0.51:1, greater than or equal to about 0.52:1, greater than or equal to about 0.53:1, greater than or equal to about 0.54:1, greater than or equal to about 0.55:1, greater than or equal to about 0.56:1, greater than or equal to about 0.57:1, greater than or equal to about 0.58:1, greater than or equal to about 0.59:1, greater than or equal to about 0.6:1, greater than or equal to about 0.65:1, greater than or equal to about 0.7:1, or greater than or equal to about 0.75:1. In the quantum dots, a mole ratio of the Group V element (e.g., phosphorus) to the Group IIIA metal (e.g., indium) may be less than or equal to about 2:1, for example, less than or equal to about 1.9:1, less than or equal to about 1.8:1, less than or equal to about 1.7:1, less than or equal to about 1.6:1, less than or equal to about 1.5:1, less than or equal to about 1.4:1, less than or equal to about 1.3:1, less than or equal to about 1.2:1, less than or equal to about 1.1:1, less than or equal to about 1.09:1, less than or equal to about 1.08:1, less than or equal to about 1.07:1, less than or equal to about 1.06:1, less than or equal to about 1.05:1, less than or equal to about 1.04:1, less than or equal to about 1.03:1, less than or equal to about 1.02:1, or less than or equal to about 1.01:1.

In the quantum dots, a mole ratio of selenium with respect to indium may be greater than or equal to about 5:1, greater than or equal to about 7:1, greater than or equal to about 10:1, greater than or equal to about 12:1, greater than or equal to about 15:1, or greater than or equal to about 16:1. The mole ratio of selenium with respect to indium may be less than or equal to about 40:1, less than or equal to about 35:1, less than or equal to about 30:1, less than or equal to about 25:1, or less than or equal to about 20:1.

In the quantum dots, a mole ratio of sulfur with respect to indium may be greater than or equal to about 1:1, greater than or equal to about 2:1, greater than or equal to about 3:1, greater than or equal to about 4:1, greater than or equal to about 5:1, greater than or equal to about 6:1, greater than or equal to about 7:1, greater than or equal to about 8:1, greater than or equal to about 9:1, or greater than or equal to about 10:1. The mole ratio of sulfur with respect to indium may be less than or equal to about 40:1, less than or equal to about 35:1, less than or equal to about 30:1, less than or equal to about 25:1, less than or equal to about 20:1, or less than or equal to about 15:1.

In the quantum dots, a mole ratio of zinc with respect to selenium may be less than or equal to about 10:1, less than or equal to about 9:1, less than or equal to about 8:1, less than or equal to about 7:1, less than or equal to about 6:1, less than or equal to about 5:1, less than or equal to about 4:1, less than or equal to about 3:1, or less than or equal to about 2:1. In the quantum dots, the mole ratio of zinc with respect to selenium may be greater than or equal to about 0.2:1, greater than or equal to about 0.3:1, greater than or equal to about 0.4:1, greater than or equal to about 0.5:1, greater than or equal to about 0.6:1, greater than or equal to about 0.7:1, greater than or equal to about 0.8:1, greater than or equal to about 0.9:1, greater than or equal to about 1:1, greater than or equal to about 1.1:1, greater than or equal to about 1.2:1, greater than or equal to about 1.3:1, or greater than or equal to about 1.4:1.

In the quantum dots, a mole ratio of indium with respect to selenium (or phosphorus with respect to selenium) may be less than or equal to about 0.9:1, less than or equal to about 0.8:1, less than or equal to about 0.7:1, less than or equal to about 0.6:1, less than or equal to about 0.5:1, less than or equal to about 0.4:1, less than or equal to about 0.3:1, less than or equal to about 0.2:1, less than or equal to about 0.1:1, less than or equal to about 0.09:1, less than or equal to about 0.08:1, less than or equal to about 0.07:1, or less than or equal to about 0.06:1 and greater than or equal to about 0.001:1, greater than or equal to about 0.003:1, greater than or equal to about 0.006:1, greater than or equal to about 0.009:1, greater than or equal to about 0.01:1, greater than or equal to about 0.015:1, greater than or equal to about 0.02:1, greater than or equal to about 0.025:1, greater than or equal to about 0.03:1, greater than or equal to about 0.035:1, greater than or equal to about 0.04:1, greater than or equal to about 0.045:1, or greater than or equal to about 0.05:1.

In the quantum dots, a mole ratio between the Group VI element present in the template (or template and shell) (e.g., selenium, hereinafter also referred to as a first Group VI element) and the Group VI element present in the shell (e.g., sulfur, hereinafter also referred to as a second Group VI element) may be appropriately selected.

In the quantum dots, a mole ratio of sulfur with respect to selenium may be less than or equal to about 10:1, less than or equal to about 9:1, less than or equal to about 8:1, less than or equal to about 7:1, less than or equal to about 6:1, less than or equal to about 5:1, less than or equal to about 4:1, less than or equal to about 3:1, less than or equal to about 2:1, less than or equal to about 1:1, less than or equal to about 0.9:1, less than or equal to about 0.8:1, less than or equal to about 0.7:1, less than or equal to about 0.6:1, less than or equal to about 0.5:1, less than or equal to about 0.4:1, or less than or equal to about 0.3:1 and greater than or equal to about 0.001:1, greater than or equal to about 0.002:1, greater than or equal to about 0.003:1, greater than or equal to about 0.004:1, greater than or equal to about 0.005:1, greater than or equal to about 0.006:1, greater than or equal to about 0.007:1, greater than or equal to about 0.008:1, greater than or equal to about 0.009:1, greater than or equal to about 0.01:1, greater than or equal to about 0.02:1, greater than or equal to about 0.03:1, greater than or equal to about 0.04:1, greater than or equal to about 0.05:1, greater than or equal to about 0.06:1, greater than or equal to about 0.07:1, greater than or equal to about 0.08:1, greater than or equal to about 0.09:1, greater than or equal to about 0.1:1, or greater than or equal to about 0.15:1, greater than or equal to about 0.2:1, greater than or equal to about 0.25:1, or greater than or equal to about 0.3:1.

A diameter of the template and a thickness of the quantum well may be adjusted in consideration of the desired emission wavelength and composition of quantum dots. In quantum dots of an embodiment, the diameter of the template may be greater than or equal to about 0.8 nm, greater than or equal to about 1 nm, greater than or equal to about 1.1 nm, greater than or equal to about 1.2 nm, greater than or equal to about 1.3 nm, greater than or equal to about 1.4 nm, greater than or equal to about 1.5 nm, greater than or equal to about 1.6 nm, greater than or equal to about 1.7 nm, greater than or equal to about 1.8 nm, greater than or equal to about 1.9 nm, greater than or equal to about 2 nm, greater than or equal to about 2.1 nm, greater than or equal to about 2.2 nm, greater than or equal to about 2.3 nm, greater than or equal to about 2.4 nm, greater than or equal to about 2.5 nm, greater than or equal to about 2.6 nm, greater than or equal to about 2.7 nm, greater than or equal to about 2.8 nm, greater than or equal to about 2.9 nm, or greater than or equal to about 3.0 nm. The diameter of the template may be less than or equal to about 5 nm, less than or equal to about 4 nm, less than or equal to about 3.5 nm, less than about 3.5 nm, less than or equal to about 3.4 nm, less than or equal to about 3.3 nm, less than or equal to about 3.2 nm, less than or equal to about 3.1 nm, less than or equal to about 3 nm, less than or equal to about 2.9 nm, less than or equal to about 2.8 nm, less than or equal to about 2.7 nm, less than or equal to about 2.6 nm, less than or equal to about 2.5 nm, less than or equal to about 2.4 nm, less than or equal to about 2.3 nm, less than or equal to about 2.2 nm, less than or equal to about 2.1 nm, or less than or equal to about 2 nm.

The thickness of the quantum well may be greater than or equal to about 0.05 nm, for example, greater than or equal to about 0.1 nm, greater than or equal to about 0.15 nm, greater than or equal to about 0.2 nm, greater than or equal to about 0.25 nm, greater than or equal to about 0.3 nm, or greater than or equal to about 0.4 nm. The thickness of the quantum well may be less than or equal to about 1.5 nm, for example, less than or equal to about 1.4 nm, less than or equal to about 1.35 nm, less than or equal to about 1.33 nm, less than or equal to about 1.32 nm, less than or equal to about 1.31 nm, less than or equal to about 1.3 nm, less than or equal to about 1.2 nm, less than or equal to about 1.1 nm, less than or equal to about 1.0 nm, less than or equal to about 0.9 nm, less than or equal to about 0.8 nm, less than or equal to about 0.7 nm, or less than or equal to about 0.6 nm.

The thickness of the shell may be greater than or equal to about 0.5 nm, greater than or equal to about 0.6 nm, greater than or equal to about 0.7 nm, greater than or equal to about 0.8 nm, greater than or equal to about 0.9 nm, greater than or equal to about 1 nm, greater than or equal to about 1.1 nm, greater than or equal to about 1.2 nm, greater than or equal to about 1.3 nm, greater than or equal to about 1.4 nm, or greater than or equal to about 1.5 nm and less than or equal to about 4 nm, less than or equal to about 3.5 nm, less than or equal to about 3.0 nm, less than or equal to about 2.9 nm, less than or equal to about 2.8 nm, less than or equal to about 2.7 nm, less than or equal to about 2.6 nm, less than or equal to about 2.4 nm, less than or equal to about 2.3 nm, less than or equal to about 2.2 nm, less than or equal to about 2.1 nm, or less than or equal to about 2.0 nm.

Quantum dots according to an embodiment have a quantum well structure and may include an additional metal, halogen, or a combination thereof (for example, in the quantum well layer, at an interface of the quantum well layer with an adjacent layer thereof e.g., at the interface of the quantum well layer and the template, or at the interface of the quantum well layer and an adjacent layer, or a combination thereof). Accordingly, the UV-Vis absorption spectrum of an embodiment of the quantum dots (as described herein) may not have an inflection point or a portion where a slope changes from negative to positive (e.g., valley) in the range of greater than or equal to about 390 nm, greater than or equal to about 400 nm, greater than or equal to about 410 nm, greater than or equal to about 415 nm, greater than or equal to about 420 nm, greater than or equal to about 425 nm, greater than or equal to about 430 nm, greater than or equal to about 435 nm, greater than or equal to about 440 nm, greater than or equal to about 445 nm, greater than or equal to about 450 nm, greater than or equal to about 455 nm, greater than or equal to about 460 nm, greater than or equal to about 465 nm, greater than or equal to about 470 nm, greater than or equal to about 475 nm, greater than or equal to about 480 nm, greater than or equal to about 485 nm, or greater than or equal to about 490 nm and less than or equal to about 620 nm, less than or equal to about 550 nm, less than or equal to about 540 nm, less than or equal to about 530 nm, less than or equal to about 520 nm, less than or equal to about 510 nm, less than or equal to about 500 nm, less than or equal to about 495 nm, less than or equal to about 490 nm, less than or equal to about 485 nm, less than or equal to about 480 nm, less than or equal to about 475 nm, less than or equal to about 470 nm, less than or equal to about 465 nm, less than or equal to about 460 nm, less than or equal to about 455 nm, less than or equal to about 450 nm, less than or equal to about 445 nm, less than or equal to about 440 nm, less than or equal to about 435 nm, less than or equal to about 430 nm, less than or equal to about 425 nm, or less than or equal to about 420 nm (or a combination of the foregoing ranges).

The UV-Vis absorption spectrum curve of the quantum dots may not have a first absorption peak.

As used herein, an inflection point refers to a point on a curve at which the concavity (e.g., clearly) changes. For example, the curve may be changed from concave (concave downward) to convex (concave upward) or vice versa.

According to an embodiment, the quantum dots may emit green light, and the UV-Vis absorption spectrum curve of quantum dots may not exhibit an inflection point within the wavelength range of about 450 nm to about 540 nm. The quantum dots may emit red light and the UV-Vis absorption spectrum curve of quantum dots may not exhibit an inflection point within the wavelength range of about 550 nm to about 620 nm.

While not wanting to be bound by theory, it is understood that the aforementioned UV-Vis absorption spectrum curve implies that the emission region in the quantum dot according to an embodiment is present in the quantum well layer (unlike in a core-shell type quantum dot), and the quantum dot (or quantum dots) according to an embodiment having the aforementioned UV-Vis absorption spectrum may exhibit an improved blue light absorption rate.

When emitting red light, a maximum photoluminescence peak wavelength of the quantum dots may be greater than or equal to about 600 nm, for example, 610 nm, greater than or equal to about 620 nm, and less than or equal to about 650 nm, for example, less than or equal to about 640 nm, or less than or equal to about 635 nm. When emitting green light, a maximum photoluminescence peak wavelength of the quantum dots may be greater than or equal to about 500 nm, for example, greater than or equal to about 510 nm, greater than or equal to about 520 nm, greater than or equal to about 530 nm, or greater than or equal to about 540 nm and less than or equal to about 580 nm, for example, less than or equal to about 570 nm, less than or equal to about 560 nm, or less than or equal to about 550 nm.

The quantum dots may exhibit increased blue light absorption rate.

A ratio of an intensity at a wavelength of 450 nm with respect to an intensity at a wavelength of 500 nm in the UV-Vis absorption spectrum curve of quantum dots of an embodiment emitting green light may be greater than or equal to about 1.2:1, for example, greater than or equal to about 1.3:1, greater than or equal to about 1.4:1, greater than or equal to about 1.5:1, greater than or equal to about 1.6:1, greater than or equal to about 1.7:1, greater than or equal to about 1.8:1, greater than or equal to about 1.9:1, greater than or equal to about 2.0:1, or greater than or equal to about 2.1:1.

A ratio of an intensity at a wavelength of 450 nm with respect to an intensity at a wavelength of (e.g., about 600 nm or about 590 nm) in the UV-Vis absorption spectrum curve of quantum dots of an embodiment emitting red light may be greater than or equal to about 1.2:1, for example, greater than or equal to about 1.3:1, greater than or equal to about 1.4:1, greater than or equal to about 1.5:1, greater than or equal to about 1.6:1, greater than or equal to about 1.7:1, greater than or equal to about 1.8:1, greater than or equal to about 1.9:1, greater than or equal to about 2.0:1, or greater than or equal to about 2.1:1.

In quantum dots of an embodiment, an emission center may exist in the quantum well, not the template. In other words, charge carriers may be at least partially (e.g., completely) confined or delocalized in the shell. Therefore, the emission wavelength may be controlled by adjusting the thickness of the quantum well.

In an embodiment, the quantum dot(s) may have a (average) size of greater than or equal to about 3 nm, for example, greater than or equal to about 4 nm, greater than or equal to about 5 nm, or greater than or equal to about 6 nm. Quantum dots of an embodiment may have a (average) size of less than or equal to about 20 nm, for example, less than or equal to about 20 nm, less than or equal to about 19 nm, less than or equal to about 18 nm, less than or equal to about 17 nm, less than or equal to about 16 nm, less than or equal to about 15 nm, less than or equal to about 14 nm, less than or equal to about 13 nm, less than or equal to about 12 nm, or less than or equal to about 10 nm. The size of the quantum dots may be a particle diameter or an equivalent particle diameter (e.g., an equivalent circle area) calculated by assuming a spherical shape from a two-dimensional image obtained from an electron micrograph of the quantum dot. The particle diameter (or equivalent particle diameter) in the present specification may be a measurement value for a single particle or an average value for a plurality of particles.

Quantum dots of an embodiment may be configured to form a population that emits green light. An average size of the quantum dots of the population may be greater than or equal to about 3 nm, greater than or equal to about 3.5 nm, greater than or equal to about 4 nm, greater than or equal to about 4.5 nm, greater than or equal to about 5.5 nm, greater than or equal to about 5.6 nm, greater than or equal to about 5.7 nm, greater than or equal to about 5.8 nm, greater than or equal to about 5.9 nm, or greater than or equal to about 6.0 nm. In the case of green light emitting quantum dots, the size may be less than or equal to about 20 nm, for example, less than or equal to about 15 nm, less than or equal to about 14 nm, less than or equal to about 13 nm, less than or equal to about 12 nm, less than or equal to about 11 nm, or less than or equal to about 10 nm.

Quantum dots of an embodiment may be configured to form a population that emits red light. An average size of the quantum dots of the population may be greater than or equal to about 4 nm, greater than or equal to about 4.5 nm, greater than or equal to about 5.0 nm, for example, greater than or equal to about 6.5 nm, greater than or equal to about 6.6 nm, greater than or equal to about 6.7 nm, greater than or equal to about 6.8 nm, greater than or equal to about 6.9 nm, greater than or equal to about 7.0 nm, greater than or equal to about 7.1 nm, greater than or equal to about 7.2 nm, greater than or equal to about 7.3 nm, greater than or equal to about 7.4 nm, or greater than or equal to about 7.5 nm. In the case of red light emitting quantum dots, the size may be less than or equal to about 20 nm, for example, less than or equal to about 15 nm, less than or equal to about 14 nm, less than or equal to about 13 nm, less than or equal to about 12 nm, less than or equal to about 11 nm, or less than or equal to about 10 nm.

Quantum dots of an embodiment may constitute a population having a standard deviation of less than or equal to about 20%, less than or equal to about 19%, less than or equal to about 18%, less than or equal to about 17%, less than or equal to about 16%, or less than or equal to about 15% of the average size.

Quantum dots according to an embodiment may include an organic ligand of RCOOH, RNH$_2$, R$_2$NH, R$_3$N, RSH, RH$_2$PO, R$_2$HPO, R$_3$PO, RH$_2$P, R$_2$HP, R$_3$P, ROH, RCOOR, RPO(OH)$_2$, RPOOH, RHPOOH, R$_2$POOH (wherein, R is the same or different and is independently a substituted or unsubstituted C1 to C40 aliphatic hydrocarbon group (e.g., a C1 to C40 alkyl group, a C2 to C40 alkenyl group, or a C2 to C40 alkynyl group), a substituted or unsubstituted C6 to C40 aromatic hydrocarbon group (e.g., C6 to C20 aryl group), or a combination thereof, provided that at least one R is not hydrogen), or a combination thereof, on a surface of the quantum dots. The organic ligand coordinates, e.g., binds to, a surface of the quantum dots, and may allow nanocrystals to be well dispersed in a solution in the producing process of the quantum dots described herein, may affect luminescence and electrical properties of the quantum dots, or a combination thereof. Specific examples of the organic ligand may be methane thiol, ethane thiol, propane thiol, butane thiol, pentane thiol, hexane thiol, octane thiol, dodecane thiol, hexadecane thiol, octadecane thiol, or benzyl thiol; methane amine, ethane amine, propane amine, butyl amine, pentyl amine, hexyl amine, octyl amine, dodecyl amine, hexadecyl amine, octadecyl amine, dimethyl amine, diethyl amine, dipropyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid; a phosphine such as a substituted or unsubstituted methyl phosphine (e.g., trimethyl phosphine, methyl diphenyl phosphine, etc.), a substituted or unsubstituted ethyl phosphine (e.g., triethyl phosphine, ethyl diphenyl phosphine, etc.), a substituted or unsubstituted propyl phosphine, a substituted or unsubstituted butyl phosphine, a substituted or unsubstituted pentyl phosphine, a substituted or unsubstituted octylphosphine (e.g., trioctylphosphine (TOP)), and the like; a phosphine oxide such as a substituted or unsubstituted methyl phosphine oxide (e.g., trimethyl phosphine oxide, methyl diphenyl phosphine oxide, etc.), a substituted or unsubstituted ethyl phosphine oxide (e.g., triethyl phosphine oxide, ethyl diphenyl phosphine oxide, etc.), a substituted or unsubstituted propyl phosphine oxide, a substituted or unsubstituted butyl phosphine oxide, a substituted or unsubstituted octylphosphine oxide (e.g., trioctylphosphine oxide (TOPO)), and the like; diphenyl phosphine, triphenyl phosphine, or an oxide compound thereof; phosphonic acid, and the like, but are not limited thereto. A mixture of two or more different organic ligands may be used. The organic ligand may be a mixture of a carboxylic acid and an amine.

Quantum dots of an embodiment may be produced by a colloidal synthesis method, and thus, may include the aforementioned organic ligand on a surface of the quantum dots, the organic solvent described herein on a surface of the quantum dots, or a combination thereof. The organic ligand, the organic solvent, or a combination thereof may be bound to the surface of the quantum dots.

Accordingly, in an embodiment, the method of producing the aforementioned quantum dot includes: providing a template including a first semiconductor nanocrystal including a Group II-VI compound; providing a quantum well including a second semiconductor nanocrystal including a Group IIIA metal and a Group V element on the template; and providing a shell including a third semiconductor nanocrystal including a Group II-VI compound on the quantum well, wherein the method further includes, after providing the template (and, for example, before forming a shell), injecting a source for additional metal and halogen to the reaction system.

The method may further include forming a buffer layer including a Group II-V compound, a Group II-III-V compound including zinc, an aluminum phosphorous oxide, or a combination thereof, on the template. The forming of the buffer layer may contribute to the formation of quantum dots having the aforementioned composition and optical properties (e.g., UV-Vis absorption spectrum curve without a first absorption peak). While not wanting to be bound by theory, it is understood that when forming the buffer layer, the quantum well may be more stably formed on the template, and the quantum well (layer) may be more uniformly coated on a surface of the template. According to the method, after separating and cleaning the template formed on the buffer layer, the buffer layer may be used again to form a desirable quantum well (layer).

In the formation of the quantum well (with the formation of the buffer layer as desired), types and amounts of the metal/non-metal precursor may be selected taking into consideration a composition and a thickness of the quantum well (including the buffer layer as desired).

Details of the template, the quantum well, and the shell are as described herein. Depending on the composition of the template, quantum well, and shell, metal and non-metal precursors may be appropriately selected. The metal precursor may include a metal powder, alkylated metal, a metal carboxylate, a metal hydroxide, a metal halide, a metal oxide, a metal nitrate, a metal sulfate, a metal acetylacetonate, or a combination thereof, but is not limited thereto.

The non-metal precursor may be selected from non-nitrogen containing compounds used in synthesis of quantum dots.

A quantum dot may include a template including a first semiconductor nanocrystal including zinc selenide; a quantum well including a second semiconductor nanocrystal including indium and phosphorus; and a shell including a third semiconductor nanocrystal including zinc and chalcogen element (e.g., sulfur, selenide, or a combination thereof), but is not limited thereto.

In order to form a template, under the presence of an organic ligand, a zinc precursor and a selenium precursor are reacted in an organic solvent. The method may include separating the formed template.

The organic solvent may be a C6 to C22 primary amine such as hexadecylamine; a C6 to C22 secondary amine such as dioctylamine; a C6 to C40 tertiary amine such as trioctylamine; a nitrogen-containing heterocyclic compound such as pyridine; a C6 to C40 aliphatic hydrocarbon (e.g., alkane, alkene, alkyne, etc.) such as hexadecane, octadecane, octadecene, or squalane; a C6 to C30 aromatic hydrocarbon such as phenyldodecane, phenyltetradecane, or phenyl hexadecane; a phosphine substituted with a C6 to C22 alkyl group such as trioctylphosphine; a phosphine oxide substituted with a C6 to C22 alkyl group such as trioctylphosphine oxide; a C12 to C22 aromatic ether such as phenyl ether, or benzyl ether, or a combination thereof. Types and amounts of the organic solvent may be appropriately selected taking into consideration precursors and organic ligands.

Types of the precursor are not particularly limited and may be appropriately selected. In an embodiment, types of the zinc precursor may be appropriately selected. Examples of the zinc precursor may be a Zn metal powder (e.g., dimethylzinc, diethylzinc, etc.) an alkylated Zn compound, Zn alkoxide, Zn carboxylate, Zn nitrate, Zn perchlorate, Zn sulfate, Zn acetylacetonate, Zn halide, Zn cyanide, Zn hydroxide, Zn oxide, Zn peroxide, or a combination thereof. A combination of two or more different zinc precursors may be used.

The selenium precursor may include selenium-trioctylphosphine (Se-TOP), selenium-tributylphosphine (Se-TBP), selenium-triphenylphosphine (Se-TPP), selenium-diphenylphosphine (Se-DPP), or a combination thereof, but is not limited thereto.

The reaction may be performed at a temperature of greater than or equal to about 280° C., for example, greater than or equal to about 290° C. The reaction temperature may be less than or equal to about 350° C. A reaction time may be less than about 1 hour, for example, less than or equal to about 50 minutes. The reaction time may be greater than or equal to about 20 minutes, for example, greater than or equal to about 30 minutes.

The formed template may be separated by addition of a nonsolvent, but is not limited thereto. For example, the addition of a nonsolvent to the prepared final reaction solution may allow nanocrystals coordinated with the organic ligands to be separated (e.g., precipitated). The separated template may be washed using the nonsolvent.

The nonsolvent may be a polar solvent that is miscible with the solvent used in the reaction and nanocrystals are not dispersible therein.

The nonsolvent may be selected depending on the organic solvent used in the reaction and may be for example, acetone, ethanol, butanol, isopropanol, ethanediol, water, tetrahydrofuran (THF), dimethylsulfoxide (DMSO), diethyl ether, formaldehyde, acetaldehyde, a solvent having a similar solubility parameter to the foregoing solvents, or a combination thereof. The separation may be performed through a centrifugation, precipitation, chromatography, or distillation. The separated nanocrystals may be added to the washing solvent and then washed as desired. The washing solvent is not particularly limited, and a solvent having a solubility parameter similar to that of the organic ligand may be used. Examples thereof may include hexane, heptane, octane, chloroform, toluene, and benzene.

For the formation of the quantum well, an indium precursor and a phosphorus precursor may be reacted in an organic solvent in the presence of an organic ligand and the template. When forming the quantum well, the type and amount of the metal/non-metal precursor may be selected in consideration of the composition and thickness of the quantum well.

A precursor for the formation of the quantum well may be based on indium and phosphorus (e.g., indium phosphide), but is not limited thereto.

Types of the indium precursor may be appropriately selected. Examples of the indium precursor may be trimethyl indium, C1 or more, C5 or more, C10 or more, or C12 or more indium carboxylate such as indium acetate, indium palmitate, indium stearate, or the like, indium hydroxide, indium chloride, indium oxide, indium nitrate, indium sulfate, or a combination thereof.

Types of the phosphorus precursor may be appropriately selected. Examples of the phosphorus precursor may be tris(trimethylsilyl)phosphine, tris(dimethylamino) phosphine, triethylphosphine, tributylphosphine, trioctylphosphine, triphenylphosphine, tricyclohexylphosphine, or a combination thereof.

The reaction for formation of the quantum well may be performed at a temperature of greater than or equal to about 250° C., greater than or equal to about 260° C., greater than or equal to about 270° C., greater than or equal to about 280° C., greater than or equal to about 290° C., or greater than or equal to about 300° C. and less than or equal to about 380° C., or less than or equal to about 370° C.

The reaction time for formation of the quantum well may be controlled by taking into consideration reactivity of the precursors, a reaction temperature, and a desired well thickness. In an embodiment, the reaction time may be adjusted to less than about 4 hours, for example, less than or equal to about 3 hours. The reaction time may be greater than or equal to about 20 minutes, for example, greater than or equal to about 30 minutes.

After forming the template, for example, a source for the additional metal and halogen is injected to the reaction system, for example, during forming the quantum well, for example, at the aforementioned reaction temperature for forming the quantum well. The source for the additional metal and halogen may include a halide of the additional metal. The source for the additional metal and halogen may be a halide of alkaline metal (e.g., sodium chloride, potassium chloride, lithium chloride, etc.), a halide of alkaline-earth metal (e.g., magnesium chloride, calcium chloride, etc.), an aluminum halide, or a combination thereof. The content of the source for the additional metal and/or the halogen may be appropriately selected taking into consideration the desirable final composition, the using precursor, and the like. The source for the additional metal and/or the halogen may be injected into the reaction system (e.g., in a dissolved state) together with an appropriate solvent (e.g., solvent having a boiling point of less than or equal to about 110° C.). The appropriate solvent may be an aqueous solvent (water or solvent miscible with water, for example, acetone). The appropriate solvent may be a non-aqueous solvent. While not wanting to be bound by theory, it is understood that injection of a solution including the additional metal and halogen at a predetermined concentration may contribute to improving physical properties of the produced quantum dots.

Particles where the quantum well is formed and the additional metal and halogen are included may be separated by adding a nonsolvent to a reaction system. The separated particles may be optionally washed. In formation of the quantum well, details of the organic ligand, the nonsolvent, and the like are the same as described herein.

In order to form a shell on the quantum well, a metal precursor (e.g., a zinc precursor) and a non-metal precursor (e.g., a selenium precursor, a sulfur precursor, or a combination thereof) may be reacted in an organic solvent under presence of the organic ligand and the particles having the quantum well.

Details of the organic ligand, the zinc precursor, the selenium precursor, and the organic solvent are the same as described herein.

Types of the sulfur precursor may be appropriately selected. The sulfur precursor may be hexane thiol, octane thiol, decane thiol, dodecane thiol, hexadecane thiol, mercaptopropylsilane, sulfur-trioctylphosphine (S-TOP), sulfur-tributylphosphine (S-TBP), sulfur-triphenylphosphine (S-TPP), sulfur-trioctylamine (S-TOA), bistrimethylsilyl sulfur, ammonium sulfide, sodium sulfide, or a combination thereof.

The reaction for forming the shell may be performed at greater than about 200° C., for example, greater than or equal to about 210° C., greater than or equal to about 220° C., greater than or equal to about 230° C., greater than or equal to about 240° C., greater than or equal to about 250° C., greater than or equal to about 260° C., greater than or equal to about 270° C., greater than or equal to about 280° C., greater than or equal to about 290° C. and less than or equal to about 350° C., or less than or equal to about 340° C.

Reaction time for forming the shell may be controlled by taking into consideration reactivity of the precursors, the reaction temperature, and a desired shell thickness. In an embodiment, the reaction time may be less than or equal to about 3 hours, for example, less than or equal to about 2 hours, or less than or equal to about 1 hour. The reaction time may be greater than or equal to about 20 minutes, for example, greater than or equal to about 30 minutes.

In each aforementioned process, a type/amount of precursors or an amount, e.g., mole, ratio thereof may be determined by taking into consideration a composition thereof in a final quantum dot (a template, a quantum well, and a shell), reactivity thereof, and the like.

Each aforementioned process (e.g., formation of the template, formation of the quantum well, and formation of the shell) may include heating (or vacuum-treating) the organic solvent and the metal precursor optionally, along with a ligand compound at a predetermined temperature (e.g., greater than or equal to about 100° C.) under vacuum and heating them again at a predetermined temperature (e.g., greater than or equal to about 100° C.) after converted into an inert gas atmosphere.

Injection of the metal precursor, non-metal precursor, or a combination thereof may be sequentially or simultaneously performed, and a temperature of injecting the precursors may be appropriately determined. For example, when a multi-layered shell or a multi-layered quantum well is formed, the metal precursor, non-metal precursor, or a combination thereof forming the shell may be injected several times in a different ratio during the reaction time.

Quantum dots applied to a color filter may be provided in a shape of a composite pattern which may be dispersed in a host matrix (e.g., including a polymer, an inorganic material, or a combination thereof). The weight of quantum dots included in the composite may be appropriately selected. The quantum dot according to an embodiment may exhibit an increased blue light absorption rate, and may exhibit an improved blue absorption rate even at a limited weight. The composition according to an embodiment includes the aforementioned quantum dot, and a quantum dot pattern or a pattern of the quantum dot polymer composite may be provided. The produced pattern may exhibit an improved blue light absorption rate.

The composition according to an embodiment includes the aforementioned (e.g., a plurality of) quantum dot(s); a dispersing agent; and an (organic) solvent. The dispersing agent may include a binder polymer including a carboxylic acid group. The composition may further include a (photo) polymerizable monomer including a carbon-carbon double bond and optionally (thermal or photo) initiator.

An amount of the aforementioned quantum dot in the composition may be appropriately adjusted taking into consideration a desirable final use (e.g., color filter, etc.). In an embodiment, the amount of the quantum dot may be greater than or equal to about 1 weight percent (wt %), for example, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 15 wt %, greater than or equal to about 20 wt %, greater than or equal to about 25 wt %, greater than or equal to about 30 wt %, greater than or equal to about 35 wt %, or greater than or equal to about 40 wt %, based on a solid content of the composition. The amount of the quantum dot may be less than or equal to about 70 wt %, for example, less than or equal to about 65 wt %, less than or equal to about 60 wt %, less than or equal to about 55 wt %, or less than or equal to about 50 wt %, based on a solid content of the composition.

The composition according to an embodiment may be used to produce a quantum dot-polymer composite pattern. The composition according to an embodiment may be a quantum dot-containing photoresist composition to which a photolithography method may be applied. The composition according to an embodiment may be an ink composition that may provide a pattern by printing (e.g., a droplet discharge method such as inkjet printing). The composition according to an embodiment may not include a conjugated polymer (except a cardo binder described herein). The composition according to an embodiment may include a conjugated polymer. Herein, the conjugated polymer refers to a polymer having a conjugation double bond in a main chain of the polymer (e.g., polyphenylenevinylene, etc.).

In the composition according to an embodiment, a dispersing agent may ensure dispersion of the quantum dots. In an embodiment, the dispersing agent may be a binder polymer. The binder polymer may include a carboxylic acid group. The binder polymer may include a copolymer of a monomer mixture including a first monomer including a carboxylic acid group and a carbon-carbon double bond, a second monomer including a carbon-carbon double bond and a hydrophobic moiety and not including a carboxylic acid group, and optionally a third monomer including a carbon-carbon double bond and a hydrophilic moiety and not including a carboxylic acid group;

a multiple aromatic ring-containing polymer having a backbone structure where two aromatic rings are bound to a quaternary carbon atom that is a constituent atom of another cyclic moiety in the main chain and including a carboxylic acid group (—COOH) (hereinafter, a cardo binder); or a combination thereof.

The copolymer includes a first repeating unit derived from the first monomer and a second repeating unit derived from the second monomer, and optionally a third repeating unit derived from the third monomer.

Examples of the first monomer may include carboxylic acid vinyl ester compounds such as acrylic acid, methacrylic acid, maleic acid, itaconic acid, fumaric acid, 3-butenoic acid, vinyl acetate, or vinyl benzoate, but are not limited thereto. The first monomer may be at least one compound. Examples of the second monomer may be an alkenyl aromatic compound such as styrene, alpha-methyl styrene, vinyl toluene, or vinyl benzyl methyl ether; an unsaturated carboxylic acid ester compound such as methyl acrylate, methyl methacrylate, ethyl acrylate, ethyl methacrylate, butyl acrylate, butyl methacrylate, benzyl acrylate, benzyl methacrylate, cyclohexyl acrylate, cyclohexyl methacrylate, phenyl acrylate, or phenyl methacrylate; an unsaturated carboxylic acid amino alkyl ester compound such as 2-amino ethyl acrylate, 2-amino ethyl methacrylate, 2-dimethyl amino ethyl acrylate, or 2-dimethyl amino ethyl methacrylate; a maleimide such as N-phenylmaleimide, N-benzylmaleimide, N-alkylmaleimide; an unsaturated carboxylic acid glycidyl ester compound such as glycidyl acrylate or glycidyl methacrylate; a vinyl cyanide compound such as acrylonitrile, methacrylonitrile; or an unsaturated amide compound such as acryl amide or methacryl amide, but are not limited thereto.

As the second monomer, at least one compound may be used. Specific examples of the third monomer may include 2-hydroxy ethyl acrylate, 2-hydroxy ethyl methacrylate, 2-hydroxy butyl acrylate, or 2-hydroxy butyl methacrylate, but are not limited thereto. As the third monomer, at least one compound may be used.

In the copolymer, an amount of each of the first repeating unit and the second repeating unit may independently be greater than or equal to about 10 mole percent (mol %), for example, greater than or equal to about 15 mol %, greater than or equal to about 25 mol %, or greater than or equal to about 35 mol %, based on a total number of moles in the copolymer. In the copolymer, an amount of each of the first repeating unit and the second repeating unit may be less than or equal to about 90 mol %, for example, less than or equal to about 89 mol %, less than or equal to about 80 mol %, less than or equal to about 70 mol %, less than or equal to about 60 mol %, less than or equal to about 50 mol %, less than or equal to about 40 mol %, less than or equal to about 35 mol %, or less than or equal to about 25 mol %, based on a total number of moles in the copolymer. In the copolymer, if present, an amount of the third repeating unit may be greater than or equal to about 1 mol %, for example, greater than or equal to about 5 mol %, greater than or equal to about 10 mol %, or greater than or equal to about 15 mol %, based on a total number of moles in the copolymer. In the copolymer, an amount of the third repeating unit may be less than or equal to about 30 mol %, for example, less than or equal to about 25 mol %, less than or equal to about 20 mol %, less than or equal to about 18 mol %, less than or equal to about 15 mol %, or less than or equal to about 10 mol %, based on a total number of moles in the copolymer.

The binder polymer including the carboxylic acid group may include a multiple aromatic ring-containing polymer. The multiple aromatic ring-containing polymer is known as a cardo binder resin and may commercially available.

The binder polymer including the carboxylic acid group (e.g., carboxylic acid polymer) may have an acid value of greater than or equal to about 50 milligrams of potassium hydroxide per gram (mg KOH/g). For example, the carboxylic acid polymer may have an acid value of greater than or equal to about 60 mg KOH/g, greater than or equal to about 70 mg KOH/g, greater than or equal to about 80 mg KOH/g, greater than or equal to about 90 mg KOH/g, greater than or equal to about 100 mg KOH/g, greater than or equal to about 110 mg KOH/g, greater than or equal to about 120 mg KOH/g, greater than or equal to about 125 mg KOH/g, or greater than or equal to about 130 mg KOH/g. The acid value of the binder polymer may be, for example, less than or equal to about 250 mg KOH/g, for example, less than or equal to about 240 mg KOH/g, less than or equal to about 230 mg KOH/g, less than or equal to about 220 mg KOH/g, less than or equal to about 210 mg KOH/g, less than or equal to about 200 mg KOH/g, less than or equal to about 190 mg KOH/g, less than or equal to about 180 mg KOH/g, or less than or equal to about 160 mg KOH/g, but is not limited thereto. The binder polymer may have a weight average molecular weight of greater than or equal to about 1,000 grams per mole (g/mol), for example, greater than or equal to about 2,000 g/mol, greater than or equal to about 3,000 g/mol, or greater than or equal to about 5,000 g/mol. The binder polymer may have a weight average molecular weight of less than or equal to about 100,000 g/mol, for example, less than or equal to about 50,000 g/mol.

In the composition, an amount of the binder polymer may be greater than or equal to about 0.5 wt %, for example, greater than or equal to about 1 wt %, greater than or equal to about 5 wt %, greater than or equal to about 10 wt %, greater than or equal to about 15 wt %, or greater than or equal to about 20 wt %, based on a total weight of the composition, but is not limited thereto. The amount of the binder polymer may be less than or equal to about 55 wt %, for example, less than or equal to about 35 wt %, less than or equal to about 33 wt %, or less than or equal to about 30 wt %, based on a total weight of the composition. Within the ranges, dispersibility of the quantum dot may be ensured. An amount of the binder polymer may be about 0.5 wt % to about 55 wt %, based on a total weight of a solid of the composition.

In the composition, the polymerizable (e.g., photopolymerizable) monomer including the carbon-carbon double bond may include a (e.g., photopolymerizable) (meth)acryl-based monomer. The polymerizable (e.g., photopolymerizable) monomer may be a precursor for an insulating polymer. The acryl-based monomer may include alkyl(meth)acrylate, ethylene glycol di(meth)acrylate, triethylene glycol di(meth)acrylate, diethylene glycol di(meth)acrylate, 1,4-butanediol di(meth)acrylate, 1,6-hexanediol di(meth)acrylate, neopentylglycol di(meth)acrylate, pentaerythritol di(meth)acrylate, pentaerythritol tri(meth)acrylate, pentaerythritol tetra(meth)acrylate, dipentaerythritol di(meth)acrylate, dipentaerythritol tri(meth)acrylate, dipentaerythritol penta(meth)acrylate, pentaerythritol hexa(meth)acrylate, bisphenol A di(meth)acrylate, bisphenol A epoxy (meth)acrylate, trimethylolpropane tri(meth)acrylate, ethylene glycol monomethyl ether (meth)acrylate, novolac epoxy (meth)acrylate, propylene glycol di(meth)acrylate, tris(meth)acryloyloxyethyl phosphate, or a combination thereof.

An amount of the monomer may be greater than or equal to about 0.5 wt %, for example, greater than or equal to about 1 wt % or greater than or equal to about 2 wt %, based on a total weight of the composition. The amount of the (e.g., photopolymerizable) monomer may be less than or equal to about 30 wt %, for example, less than or equal to about 28 wt %, less than or equal to about 25 wt %, less than or equal to about 23 wt %, less than or equal to about 20 wt %, less than or equal to about 18 wt %, less than or equal to about 17 wt %, less than or equal to about 16 wt %, or less than or equal to about 15 wt %, based on a total weight of the composition.

The initiator in the composition may be used for polymerization of the aforementioned monomers. The initiator is a compound accelerating a radical reaction (e.g., radical polymerization of monomer) by producing radical chemical species under a mild condition (e.g., by heat or light). The initiator may be a thermal initiator or a photoinitiator. The initiator may be a compound capable of initiating a radical polymerization of the aforementioned polymerizable acryl-based monomer, a thiol compound (described herein), or a combination thereof by light or heat. The type of the initiator is not particularly limited. The initiator may be a thermal initiator. The thermal initiator may include azobisisobutyronitrile, benzoyl peroxide, and the like, but is not limited thereto. The initiator may be a photoinitiator. The photoinitiator may include a triazine-containing compound, an acetophenone compound, a benzophenone compound, a thioxanthone compound, a benzoin compound, an oxime ester compound, an aminoketone compound, a phosphine or phosphine oxide compound, a carbazole-containing compound, a diketone compound, a sulfonium borate-based compound, a diazo-containing compound, a biimidazole-containing compound, or a combination thereof, but is not limited thereto.

In the composition, an amount of the initiator may be appropriately adjusted taking into consideration types and amounts of the polymerizable monomers. In an embodiment, the initiator may be used in an amount range of about 0.01 wt % to about 10 wt %, based on a total weight of the composition, but is not limited thereto.

The composition may further include a (multiple or mono-functional) thiol compound having at least one thiol group at a terminal end of the thiol compound, a metal oxide particulate, or a combination thereof.

The metal oxide particulate may include $TiO_2$, $SiO_2$, $BaTiO_3$, $Ba_2TiO_4$, ZnO, or a combination thereof. In the composition, an amount of the metal oxide particulate may be greater than or equal to about 1 wt % and less than or equal to about 15 wt %, less than or equal to about 10 wt %, or less than or equal to about 5 wt %, based on that of a solid content in the composition. The metal oxide particulate may have an appropriately selected diameter without a particular limit. The diameter of the metal oxide particulate may be greater than or equal to about 100 nm, for example, greater than or equal to about 150 nm, or greater than or equal to about 200 nm and less than or equal to about 1,000 nm or less than or equal to about 800 nm.

The thiol compound may include a compound represented by Chemical Formula 1:

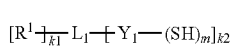

Chemical Formula 1 wherein, in Chemical Formula 1, $R^1$ is hydrogen; a substituted or unsubstituted C1 to C30 linear or branched alkyl group; a substituted or unsubstituted C6 to C30 aryl group; a substituted or unsubstituted C3 to C30 heteroaryl group; a substituted or unsubstituted C3 to C30 cycloalkyl group; a substituted or unsubstituted C3 to C30 heterocycloalkyl group; a substituted or unsubstituted C1 to C10 alkoxy group; a hydroxy group; —NH$_2$; a substituted or unsubstituted C1 to C30 amine group (—NRR', wherein R and R' are independently hydrogen or a substituted or unsubstituted C1 to C30 linear or branched alkyl group provided that both are not simultaneously hydrogen); an isocyanate group; a halogen; —ROR' (wherein R is a substituted or unsubstituted C1 to C20 alkylene group and R' is hydrogen or a substituted or unsubstituted C1 to C20 linear or branched alkyl group); an acyl halide (—RC(=O)X, wherein R is a substituted or unsubstituted alkylene group and X is a halogen); —C(=O)OR' (wherein R' is hydrogen or a substituted or unsubstituted C1 to C20 linear or branched alkyl group); —CN; —C(=O)NRR'(wherein R and R' are independently hydrogen or a substituted or unsubstituted C1 to C20 linear or branched alkyl group); or —C(=O)ONRR' (wherein R and R' are independently hydrogen or a substituted or unsubstituted C1 to C20 linear or branched alkyl group), $L_1$ is a carbon atom, a substituted or unsubstituted C1 to C30 alkylene group, a substituted or unsubstituted C3 to C30 cycloalkylene group, a substituted or unsubstituted C6 to C30 arylene group, a substituted or unsubstituted C3 to C30 heterocycloalkylene group, or a substituted or unsubstituted C3 to C30 heteroarylene group, wherein methylene (—CH$_2$—) of the substituted C1 to C30 alkylene group may be replaced by sulfonyl (—SO$_2$—), carbonyl (CO), ether (—O—), sulfide (—S—), sulfoxide (—SO—), ester (—C(=O)O—), an amide (—C(=O)NR—) (wherein R is hydrogen or a substituted or unsubstituted C1 to C10 alkyl group), or a combination thereof, $Y_1$ is a single bond; a substituted or unsubstituted C1 to C30 alkylene group; a substituted or unsubstituted C2 to C30 alkenylene group; a substituted or unsubstituted C1 to C30 alkylene group or a substituted or unsubstituted C2 to C30 alkenylene group wherein at least one methylene (—CH$_2$—) is replaced by sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a substituted or unsubstituted C1 to C10 linear or branched alkyl group), imine (—NR—) (wherein R is hydrogen or a substituted or unsubstituted C1 to C10 linear or branched alkyl group), or a combination thereof, m is an integer of 1 or more, k1 is an integer of 0 or 1 or more, k2 is an integer of 1 or more, a sum of m and k2 is an integer of 3 or more, when $Y_1$ is not a single bond, m does not exceed a valence of $Y_1$, and a sum of k1 and k2 does not exceed a valence of $L_1$.

The thiol compound may be a dithiol compound, a trithiol compound, tetrathiol compound, or a combination thereof. For example, the thiol compound may be glycoldi-3-mercaptopropionate, glycol dimercapto acetate, trimethylolpropane tris(3-mercaptopropionate), pentaerythritol tetrakis (3-mercaptopropionate), pentaerythritol tetrakis (2-mercaptoacetate), 1,6-hexanedithiol, 1,3-propanedithiol, 1,2-ethanedithiol, polyethylene glycol dithiol including 1 to 10 ethylene glycol repeating units, or a combination thereof.

An amount of the thiol compound may be less than or equal to about 10 wt %, for example, less than or equal to about 9 wt %, less than or equal to about 8 wt %, less than or equal to about 7 wt %, less than or equal to about 6 wt %, or less than or equal to about 5 wt %, based on a total weight of the composition. The amount of the thiol compound may be greater than or equal to about 0.1 wt %, for example, greater than or equal to about 0.5 wt % or greater than or equal to about 1 wt %, based on a total weight of the composition.

The composition may further include an organic solvent (or a liquid vehicle). Types of the usable organic solvent are not particularly limited. A type and an amount of the organic solvent may be appropriately determined by taking into consideration the aforementioned main components (i.e., the quantum dot, the dispersing agent, the polymerizable monomer, the initiator, and if used, the thiol compound,) and a type and an amount of an additive described herein. The composition may include an organic solvent in a residual amount except for a desired amount of the (non-volatile) solid. Examples of the organic solvent (or liquid vehicle) may include ethyl 3-ethoxy propionate; an ethylene glycol such as ethylene glycol, diethylene glycol, or polyethylene glycol; a glycol ether such as ethylene glycol monomethyl ether, ethylene glycol monoethyl ether, diethylene glycol monomethyl ether, ethylene glycol diethyl ether, or diethylene glycol dimethyl ether; a glycol ether acetate such as ethylene glycol monomethyl ether acetate, ethylene glycol monoethyl ether acetate, diethylene glycol monoethyl ether acetate, or diethylene glycol monobutyl ether acetate; a propylene glycol such as propylene glycol; a propylene glycol ether such as propylene glycol monomethyl ether, propylene glycol monoethyl ether, propylene glycol monopropyl ether, propylene monobutyl ether, propylene glycol dimethyl ether, dipropylene glycol dimethyl ether, propylene glycol diethyl ether, or dipropylene glycol diethyl ether; a propylene glycol ether acetate such as propylene glycol monomethyl ether acetate, or dipropylene glycol monoethyl ether acetate; an amide such as N-methylpyrrolidone, dimethyl formamide, or dimethyl acetamide; a ketone such as methylethylketone (MEK), methyl isobutyl ketone (MIBK), or cyclohexanone; a petroleum such as toluene, xylene, or solvent naphtha; an esters such as ethyl acetate, butyl acetate, or ethyl lactate; an ether such as diethyl ether, dipropyl ether, or dibutyl ether; aliphatic, alicyclic, or aromatic hydrocarbons, or a combination thereof.

If desired, the composition may further include various additives such as a light diffusing agent, a leveling agent, or a coupling agent in addition to the aforementioned components. The amount of the additive is not particularly limited, and may be controlled within an appropriate range wherein the additive does not cause an adverse effect on preparation of the composition and production of the quantum dot-polymer composite and optionally a patterning of the composite.

If used, the additives may be used in an amount of greater than or equal to about 0.1 wt %, for example, greater than or equal to about 0.5 wt %, greater than or equal to about 1 wt %, greater than or equal to about 2 wt %, or greater than or equal to about 5 wt %, based on a total weight of the composition, but are not limited thereto. If used, the amount of the additives may be less than or equal to about 20 wt %, for example, less than or equal to about 19 wt %, less than or equal to about 18 wt %, less than or equal to about 17 wt %, less than or equal to about 16 wt %, or less than or equal to about 15 wt %, based on a total weight of the composition, but is not limited thereto.

The composition according to an embodiment may be prepared by a method including: preparing quantum dot dispersion including the aforementioned cadmium-free quantum dot, the dispersing agent, and the organic solvent; and mixing the quantum dot dispersion with the initiator, the polymerizable monomer (e.g., acryl-based monomer); optionally, the thiol compound, optionally, the metal oxide particulate, and optionally, the additives. Each of the aforementioned components may be mixed sequentially or simultaneously, but mixing orders are not particularly limited.

The composition may provide a quantum dot-polymer composite by a (e.g., radical) polymerization.

Accordingly, in an embodiment, the quantum dot-polymer composite includes a polymer matrix; and the aforementioned cadmium-free quantum dot dispersed in the polymer matrix. The polymer matrix may include a dispersing agent (e.g., a binder polymer including a carboxylic acid group), a polymerization product (e.g., insulating polymer) of a polymerizable monomer having a carbon-carbon double bond (at least one, for example, at least two, at least three, at least four, or at least five), optionally a polymerization product of the polymerizable monomer and a multi-thiol compound having at least two thiol groups at a terminal end of the multi-thiol compound, a metal oxide particulate(s), or a combination thereof.

In an embodiment, the polymer matrix may include a cross-linked polymer and a dispersing agent (e.g., (carboxyl group-containing) binder polymer). The polymer matrix may not include a conjugated polymer (excepting cardo resin). The cross-linked polymer may include a thiolene resin, a cross-linked poly(meth)acrylate, or a combination thereof. In an embodiment, the cross-linked polymer may be a polymerization product of the polymerizable monomer and, optionally, the multi-thiol compound.

The cadmium-free quantum dot, the dispersing agent, or the binder polymer, the polymerizable monomer, and the multi-thiol compound are as described herein.

The film of the quantum dot polymer composite or the quantum dot polymer composite pattern that described herein may have, for example, a thickness, less than or equal to about 30 μm, for example, less than or equal to about 25 μm, less than or equal to about 20 μm, less than or equal to about 15 μm, less than or equal to about 10 μm, less than or equal to about 8 μm, or less than or equal to about 7 μm and greater than or equal to about 2 μm, for example, greater than or equal to about 3 μm, greater than or equal to about 3.5 μm, or greater than or equal to about 4 μm.

In an embodiment, a patterned film includes a repeating section including a first section configured to emit first light, wherein the first section includes the aforementioned quantum dot polymer composite. The repeating section may include a second section configured to emit second light having different wavelength from the first light, wherein the second section may include a quantum dot polymer composite. The quantum dot polymer composite of the second section may include a second quantum dot configured to emit the second light. The second quantum dot may include the aforementioned cadmium-free quantum dot. The first light or the second light may be red light having a maximum photoluminescence peak wavelength which is present between about 600 nm and about 650 nm (e.g., about 620 nm to about 650 nm) or green light having a maximum photoluminescence peak wavelength which is present between about 500 nm and about 550 nm (e.g., about 510 nm to about 540 nm). The patterned film may further include a third section configured to emit or pass third light (e.g., blue light) different from the first light and the second light. The third light may have a maximum peak wavelength ranging from about 380 nm to about 480 nm.

In an embodiment, a display device includes a light source and a photoluminescence element, and the photoluminescence element includes a substrate and a light emitting layer disposed on the substrate, and the light emitting layer includes a film or patterned film of the quantum dot polymer composite. The light source is configured to provide the photoluminescence element with incident light. The incident light may have a peak wavelength of greater than or equal to about 440 nm, for example, greater than or equal to about 450 nm and less than or equal to about 500 nm, for example, less than or equal to about 480 nm, less than or equal to about 470 nm, or less than or equal to about 460 nm.

In the light emitting layer (e.g., patterned film of quantum dot polymer composite) of the display device according to an embodiment, the first section may be a section configured to emit red light, and the second section may be a section configured to emit green light, and the light source may be an element configured to emit blue light.

Optical elements (blue light blocking layer or first optical filter layer described herein) for blocking (e.g., reflecting or absorbing) blue light may be disposed on front surfaces (light-emitting surfaces) of the first section and the second section.

In the aforementioned display device, the light source includes a plurality of light emitting units respectively corresponding to the first section and the second section, and the light emitting units may include a first electrode and a second electrode facing each other and an electroluminescence layer disposed between the first electrode and the second electrode. The electroluminescence layer may include an organic light emitting material. For example, each light emitting unit of the light source may include an electroluminescent device (e.g., an organic light emitting diode (OLED)) configured to emit light of a predetermined wavelength (e.g., blue light, green light, or a combination thereof). Structures and materials of the electroluminescent device and the organic light emitting diode (OLED) are not particularly limited. The light source includes an organic light emitting diode (OLED) emitting blue light (and optionally, green light).

Figure 2:
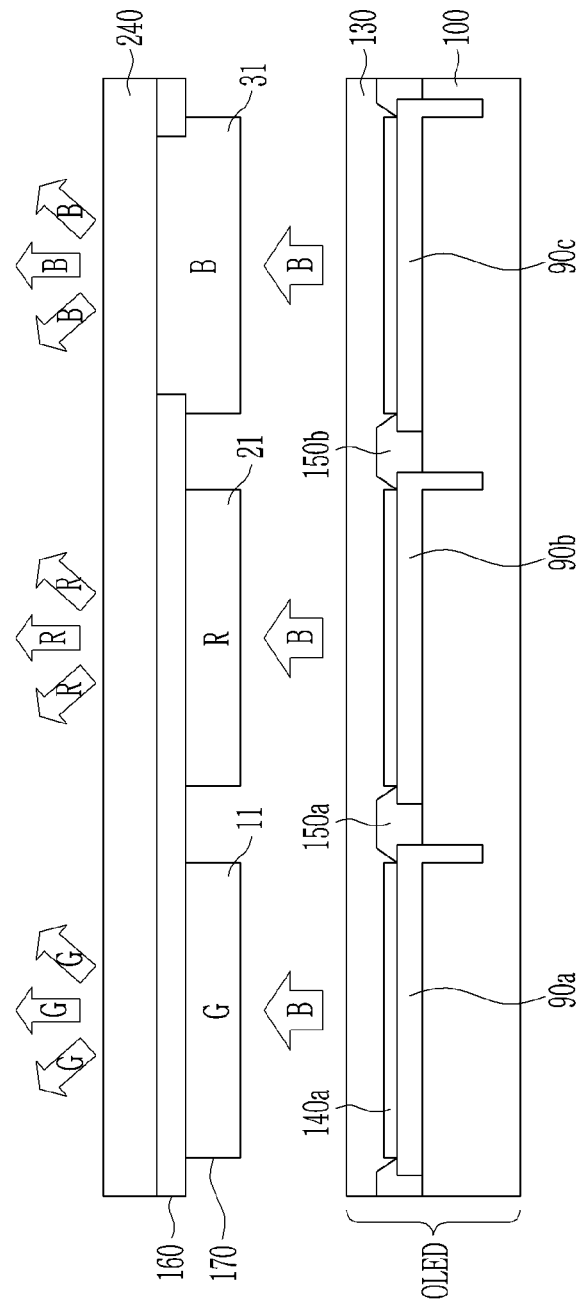
FIG. 2 schematically shows a cross-section of a device (e.g., a display device) according to an embodiment.
Figure 3:
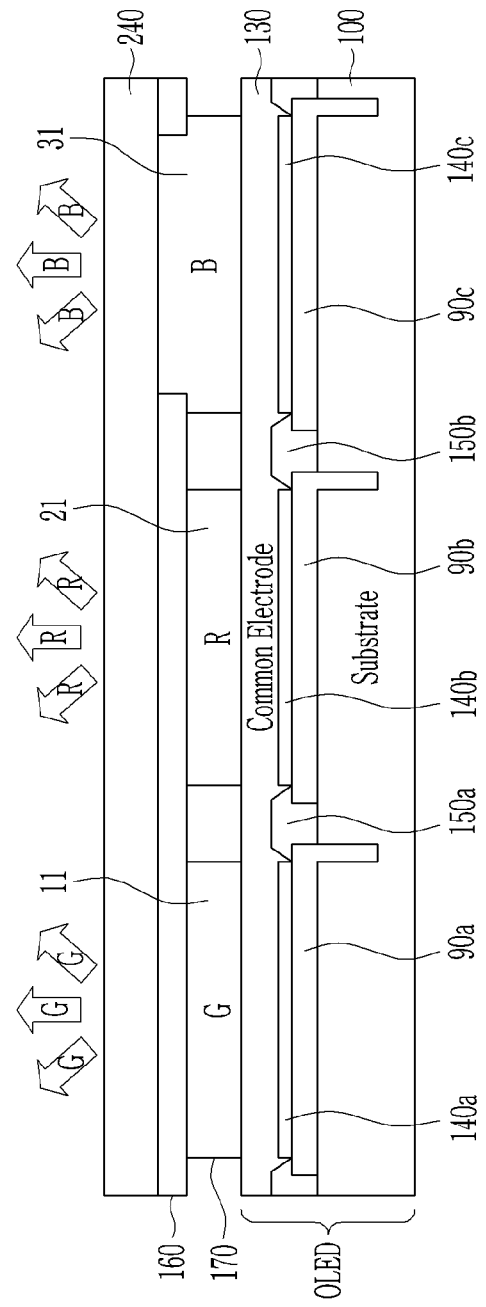
FIG. 3 schematically shows a cross-section of a device (e.g., a display device) according to an embodiment.

FIG. 2 is a schematic cross-sectional view of a display device according to an embodiment and FIG. 3 is a schematic cross-sectional view of a display device according to an embodiment. Referring to FIGS. 2 and 3, a light source includes an organic light emitting diode (OLED) emitting blue light. The organic light emitting diode OLED may include (at least two, for example, three or more) pixel electrodes 90a, 90b, 90c formed on a substrate 100, a pixel defining layer 150a, 150b formed between the adjacent pixel electrodes 90a, 90b, 90c, an organic light emitting layer 140a, 140b, 140c formed on the pixel electrodes 90a, 90b, 90c, and a common electrode layer 130 formed on the organic light emitting layer 140a, 140b, 140c. A thin film transistor and a substrate may be disposed under the organic light emitting diode (OLED).

A stack structure including a quantum dot-polymer composite (e.g., a section including red quantum dot R and a section including green quantum dot G) pattern and a substrate may be disposed on the light source. The sections are configured so that excitation light (e.g., blue light) emitted from the light source is entered thereinto and red light and green light may be emitted, respectively. Excitation light (e.g., blue light or green light) emitted from the light source may pass through the third section.

The light (e.g., blue light, green light, or blue light and green light) emitted from the light source may enter the second section 21 and the first section 11 of the quantum dot-polymer composite pattern 170 to emit (e.g., converted) red light R and green light G, respectively. The excitation light B emitted from the light source passes through or transmits from the third section 31. Over the second section emitting red light, the first section emitting green light, or a combination thereof, an optical element 160 may be disposed. The optical element may be an excitation light (e.g., blue and optionally green) cut layer which cuts (e.g., reflects or absorbs) blue light and optionally green light, or a first optical filter layer 310 (see FIG. 4). The excitation light (e.g., blue and optionally green) cut layer 160 may be disposed on the upper substrate 240. The excitation light cut layer 160 may be disposed between the upper substrate 240 and the quantum dot-polymer composite pattern and over the first section 11 and the second section 21. Details of the excitation light (e.g., blue and optionally green) cut layer are the same as set forth for the first optical filter layer 310 herein.

The display device may be obtained by separately producing the stacked structure and (e.g., blue light emitting) LED or OLED and then assembling the same. The display device may be obtained by forming a quantum dot polymer composite pattern directly on the LED or OLED.

The substrate may be a substrate including an insulating material. The substrate may include glass; various polymers such as polyester of polyethylene terephthalate (PET), or polyethylene naphthalate (PEN), polycarbonate, and polyacrylate; polysiloxane (e.g., polydimethylsiloxane (PDMS)); an inorganic material such as $Al_2O_3$ or ZnO; or a combination thereof, but is not limited thereto. A thickness of the substrate may be appropriately selected taking into consideration a substrate material but is not particularly limited. The substrate may have flexibility. The substrate may have a transmittance of greater than or equal to about 50%, greater than or equal to about 60%, greater than or equal to about 70%, greater than or equal to about 80%, or greater than or equal to about 90% for light emitted from the quantum dot.

A wire layer including a thin film transistor or the like is formed on the substrate. The wire layer may further include a gate line, a sustain voltage line, a gate insulating layer, a data line, a source electrode, a drain electrode, a semiconductor, a protective layer, and the like. The detail structure of the wire layer may be verified according to an embodiment. The gate line and the sustain voltage line are electrically separated from each other, and the data line is insulated and crossing the gate line and the sustain voltage line. The gate electrode, the source electrode, and the drain electrode form a control terminal, an input terminal, and an output terminal of the thin film transistor, respectively. The drain electrode is electrically connected to the pixel electrode described herein.

The pixel electrode may function as an anode of the display device. The pixel electrode may be formed of a transparent conductive material such as indium tin oxide (ITO) or indium zinc oxide (IZO). The pixel electrode may be formed of a material having a light-blocking properties such as gold (Au), platinum (Pt), nickel (Ni), tungsten (W), chromium (Cr), molybdenum (Mo), iron (Fe), cobalt (Co), copper (Cu), palladium (Pd), or titanium (Ti). The pixel electrode may have a two-layered structure where the transparent conductive material and the material having light-blocking properties are stacked sequentially.

Between two adjacent pixel electrodes, a pixel define layer (PDL) may be overlapped with a terminal end of the pixel electrode to divide the pixel electrode into a pixel unit. The pixel define layer may be an insulation layer which may electrically block the at least two pixel electrodes.

The pixel define layer may cover a portion of the upper surface of the pixel electrode, and the remaining region of the pixel electrode where is not covered by the pixel define layer may provide an opening. An organic light emitting layer described herein may be formed in the region defined by the opening.

The organic light emitting layer defines each pixel area by the pixel electrode and the pixel define layer. In other words, one pixel area may be defined as an area where is formed with one organic emission unit layer which is contacted with one pixel electrode divided by the pixel define layer.

For example, in the display device according to an embodiment, the organic light emitting layer may be defined as a first pixel area, a second pixel area and a third pixel area, and each pixel area is spaced apart from each other leaving a predetermined interval by the pixel define layer.

In an embodiment, the organic light emitting layer may emit a third light belong to visible light region or belong to a UV region. In other words, each of the first to the third pixel areas of the organic light emitting layer may emit third light. In an embodiment, the third light may be a light having the highest energy in the visible light region, for example, may be blue light. When all pixel areas of the organic light emitting layer are configured to emit the same light, each pixel area of the organic light emitting layer may be all formed of the same or similar materials or may exhibit the same or similar properties. Thus a process difficulty of forming the organic light emitting layer may be significantly relieved, and the display device may be easily applied for, e.g., to, a large scale/large area process. However, the organic light emitting layer according to an embodiment is not limited thereto, but the organic light emitting layer may be configured to emit at least two different lights.

The organic light emitting layer includes an organic emission unit layer in each pixel area, and each of the organic emission unit layer may further include an auxiliary layer (e.g., hole injection layer (HIL), hole transport layer (HTL), electron transport layer (ETL), etc.) besides the light emitting layer.

The common electrode may function as a cathode of the display device. The common electrode may be formed of a transparent conductive material such as indium tin oxide (ITO) or indium zinc oxide (IZO). The common electrode may be formed on the organic light emitting layer and may be integrated therewith.

A planarization layer or a passivation layer (not shown) may be formed on the common electrode. The planarization layer may include a (e.g., transparent) insulating material for ensuring electrical insulation with the common electrode.

In an embodiment, the display device may further include a lower substrate, a polarizing plate disposed under the lower substrate, and a liquid crystal layer disposed between the stacked structure and the lower substrate, and in the stacked structure, the light emitting layer may be disposed to face the liquid crystal layer. The display device may further include a polarizing plate between the liquid crystal layer and the light emitting layer. The light source may further include LED and if desired, a light guide panel.

Figure 4:
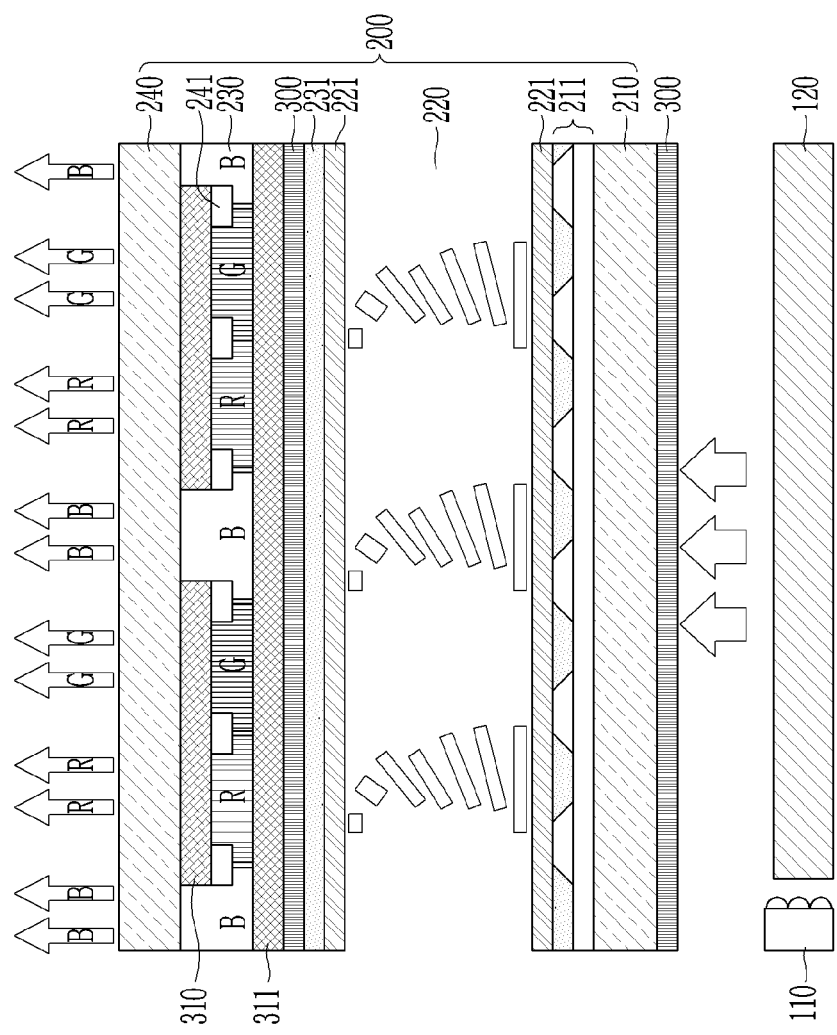
FIG. 4 schematically shows a cross-section of a device (e.g., a display device) according to an embodiment.

Non-limiting examples of the display device (e.g., a liquid crystal display device) according to an embodiment are illustrated with a reference to a drawing. FIG. 4 is a schematic cross-sectional view showing a liquid crystal display according to an embodiment. Referring to FIG. 4, the display device of an embodiment includes a liquid crystal panel 200, a polarizing plate 300 disposed under the liquid crystal panel 200, and a backlight unit (BLU) disposed under the polarizing plate 300.

The liquid crystal panel 200 includes a lower substrate 210, a stacked structure, and a liquid crystal layer 220 disposed between the stacked structure and the lower substrate. The stacked structure includes a transparent substrate (or referred to as the upper substrate) 240 and a photoluminescent layer 230 including a pattern of a quantum dot polymer composite.

The lower substrate 210 which is also referred to as an array substrate may be a transparent insulating material substrate. The substrate is the same as described herein. A wire plate 211 is provided on an upper surface of the lower substrate 210. The wire plate 211 may include a plurality of gate wires (not shown) and data wires (not shown) that define a pixel area, a thin film transistor disposed adjacent to a crossing region of gate wires and data wires, and a pixel electrode for each pixel area, but is not limited thereto. Details of such a wire plate are not particularly limited.

The liquid crystal layer 220 may be disposed on the wire plate 211. The liquid crystal panel 200 may include an alignment layer 221 on and under the liquid crystal layer 220 to initially align the liquid crystal material included therein. Details of the liquid crystal material and the alignment layer (e.g., a liquid crystal material, an alignment layer material, a method of forming liquid crystal layer, a thickness of liquid crystal layer, or the like) are not particularly limited.

A lower polarizing plate 300 is provided under the lower substrate. Materials and structures of the polarizing plate 300 are not particularly limited. A backlight unit (e.g., emitting blue light) may be disposed under the polarizing plate 300. An upper optical element or an upper polarizing plate 300 may be provided between the liquid crystal layer 220 and the transparent substrate 240, but is not limited thereto. For example, the upper polarizing plate may be disposed between the liquid crystal layer 220 and the light emitting (i.e., photoluminescent) layer 230 (hereinafter, also referred to as light emitting layer). The polarizing plate may be any polarizer that used in a liquid crystal display device. The polarizing plate may be TAC (triacetyl cellulose) having a thickness of less than or equal to about 200 µm, but is not limited thereto. In an embodiment, the upper optical element may be a coating that controls a refractive index without a polarization function.

The backlight unit includes a light source 110. The light source may emit blue light or white light. The light source may include a blue LED, a white LED, a white OLED, or a combination thereof, but is not limited thereto.

The backlight unit may further include a light guide panel 120. In an embodiment, the backlight unit may be an edge-type lighting. For example, the backlight unit may include a reflector (not shown), a light guide panel (not shown) provided on the reflector and providing a planar light source with the liquid crystal panel 200, at least one optical sheet (not shown) on the light guide panel, for example, a diffusion plate, a prism sheet, and the like, or a combination thereof, but is not limited thereto. The backlight unit may not include a light guide panel. In an embodiment, the backlight unit may be a direct lighting. For example, the backlight unit may have a reflector (not shown), and may have a plurality of fluorescent lamps disposed on the reflector at regular intervals, or may have an LED operating substrate on which a plurality of light emitting diodes may be disposed, a diffusion plate thereon, and optionally at least one optical sheet. Details (e.g., each component of a light emitting diode, a fluorescent lamp, light guide panel, various optical sheets, and a reflector) of such a backlight unit are not particularly limited.

A black matrix (BM) 241 is provided under the transparent substrate 240 and has openings and hides a gate line, a data line, and a thin film transistor of the wire plate on 5 the lower substrate. For example, the black matrix 241 may have a lattice shape. The photoluminescent layer 230 is provided in the openings of the black matrix 241 and has a quantum dot-polymer composite pattern including a first section (R) configured to emit first light (e.g., red light), a second section (G) configured to emit second light (e.g., green light), and a third section (B) 10 configured to emit/transmit, for example, blue light. If desired, the photoluminescent layer may further include at least one fourth section. The fourth section may include a quantum dot that emits different color from light emitted from the first to third sections (e.g., cyan, magenta, and yellow light).

In the light emitting layer 230, sections forming a pattern may be repeated corresponding to pixel areas formed on the lower substrate. A transparent common electrode 231 may be provided on the photoluminescent (color filter) layer.

The third section (B) configured to emit/transmit blue light may be a transparent color filter that does not change a photoluminescence spectrum of the light source. Blue light emitted from the backlight unit may enter in a polarized state and may be emitted through the polarizing plate and the liquid crystal layer as is. If desired, the third section may include a quantum dot emitting blue light.

If desired, the display device may further include a blue light blocking layer (e.g., blue cut filter) or a first optical filter layer. The blue light blocking layer may be disposed between bottom surfaces of the first section (R) and the second section (G) and the upper substrate 240 or on a top surface of the upper substrate 240. The blue light blocking layer may include a sheet having openings that correspond to a pixel area showing a blue color (e.g., third section) and may be formed on portions corresponding to the first and second sections. As shown in FIG. 4, the first optical filter layer may be integrally formed as one body structure at the remaining positions except positions overlapped with the third section, but is not limited thereto. At least two first optical filter layers may be spaced apart and be disposed on each of the positions overlapped with the first and the second sections.

For example, the first optical filter layer may block light having a portion of a wavelength region in the visible light region and transmit light having other wavelength regions. For example, the first optical filter layer may block blue light and transmit light except blue light. For example, the first optical filter layer may transmit green light, red light, or yellow light that is a mixed light thereof.

For example, the first optical filter layer may substantially block blue light having a wavelength of less than or equal to about 500 nm and may transmit light in another visible light wavelength region of greater than about 500 nm and less than or equal to about 700 nm.

For example, the first optical filter layer may have light transmittance of greater than or equal to about 70%, greater than or equal to about 80%, greater than or equal to about 90%, or even about 100%, with respect to the other visible light of greater than about 500 nm and less than or equal to about 700 nm.

The first optical filter layer may include a polymer thin film including a dye, a pigment, or a combination thereof that absorbs light having a wavelength to be blocked. The first optical filter layer may block at least 80%, or at least 90%, even at least 95% of blue light having a wavelength of less than or equal to about 480 nm and the first optical filter may have light transmittance of greater than or equal to about 70%, greater than or equal to about 80%, greater than or equal to about 90%, or even about 100%, with respect to other visible light of greater than about 500 nm and less than or equal to about 700 nm.

The first optical filter layer may block (e.g., absorb) and substantially block blue light having a wavelength of less than or equal to about 500 nm and, for example, may selectively transmit green light or red light. At least two first optical filter layers may be spaced apart and disposed on each of the portions overlapped with the first and second sections, respectively. For example, a first optical filter layer configured to selectively transmit red light may be disposed on the portion overlapped with the section configured to emit red light and the first optical filter layer configured to selectively transmit green light may be disposed on the portion overlapped with the section configured to emit green light, respectively. For example, the first optical filter layer may include a first region, a second region, or a combination thereof, wherein the first region blocks (e.g., absorb) blue light and red light and transmits light having a wavelength of a predetermined range (e.g., greater than or equal to about 500 nm, greater than or equal to about 510 nm, or greater than or equal to about 515 nm and less than or equal to about 550 nm, less than or equal to about 545 nm, less than or equal to about 540 nm, less than or equal to about 535 nm, less than or equal to about 530 nm, less than or equal to about 525 nm, or less than or equal to about 520 nm) and the second region blocks (e.g., absorb) blue light and green light and transmits light having a wavelength of a predetermined range (e.g., greater than or equal to about 600 nm, greater than or equal to about 610 nm, or greater than or equal to about 615 nm and less than or equal to about 650 nm, less than or equal to about 645 nm, less than or equal to about 640 nm, less than or equal to about 635 nm, less than or equal to about 630 nm, less than or equal to about 625 nm, or less than or equal to about 620 nm). The first region may be disposed at a place overlapped with the section configured to emit green light and the second region may be disposed at a place overlapped with the section configured to emit red light. The first region and the second region may be optically isolated. The first optical filter (layer) may contribute to improving color purity of a display device.

The first optical filter layer may be a reflective filter including a plurality of layers (e.g., inorganic material layers) with different refractive index. For example, two layers having different refractive index may be alternately stacked with each other, or, for example, a layer having a high refractive index and a layer having a low refractive index may be alternately stacked with each other As a refractive index difference between the layer having a high refractive index and the layer having a low refractive index is higher, the first optical filter layer having higher wavelength selectivity may be provided. A thickness and the stacked number of the layer having a high refractive index and the layer having a low refractive index may be determined according to a refractive index of each layer and a reflected wavelength, for example, each layer having a high refractive index may have a thickness of about 3 nm to about 300 nm, and each layer having a low refractive index may have a thickness of about 3 nm to about 300 nm.

A total thickness of the first optical filter layer may be, for example, about 3 nm to about 10,000 nm, about 300 nm to about 10,000 nm, or about 1,000 nm to about 10,000 nm. All layers having a high refractive index may have the same thickness and the same material or different from each other, and all layers having a low refractive index may have the same thickness and the same material or different from each other.

The display device may further include a second optical filter layer (e.g., red/green or yellow light recycling layer) disposed between the light emitting layer and the liquid crystal layer (e.g., between light emitting layer and upper polarizer) and transmitting at least a portion of the third light and reflecting at least a portion of the first light and the second light. The second optical filter layer may reflect light in a wavelength region of greater than about 500 nm. The first light may be red light, the second light may be green light, and the third light may be blue light.

In the display device according to an embodiment, the second optical filter layer may be formed as an integrated one layer having a relatively planar surface.

In an embodiment, the second optical filter layer may include a monolayer having a low refractive index, for example, the second optical filter layer may be a transparent thin film having a refractive index of less than or equal to about 1.4, less than or equal to about 1.3, or less than or equal to about 1.2.

The second optical filter layer having a low refractive index may be, for example, a porous silicon oxide, a porous organic material, a porous organic-inorganic composite, or a combination thereof.

In an embodiment, the second optical filter layer may include a plurality of layers having different refractive indexes, for example, the second optical filter layer may be formed by alternately stacking two layers having different refractive indexes, or for example, the second optical filter layer may be formed by alternately stacking material having a high refractive index and material having a low refractive index.

The layer having a high refractive index in the second optical filter layer may include, for example, hafnium oxide, tantalum oxide, titanium oxide, zirconium oxide, magnesium oxide, cesium oxide, lanthanum oxide, indium oxide, niobium oxide, aluminum oxide, silicon nitride, or a combination thereof. According to an embodiment, the layer having a high refractive index may include a variety of materials having a higher refractive index than the layer having a low refractive index.

The layer having a low refractive index in the second optical filter layer may include, for example, silicon oxide. According to an embodiment, the layer having a low refractive index may include a variety of materials having a lower refractive index than the layer having a high refractive index.

As the refractive index difference between the layer having a high refractive index and the layer having a low refractive index is the higher, the second optical filter layer may have the higher wavelength selectivity.

In the second optical filter layer, each thickness of the layer having a high refractive index and the layer having a low refractive index and the stacked number thereof may be determined depending upon a refractive index of each layer and the reflected wavelength. For example, each layer having a high refractive index in the second optical filter layer may have a thickness of about 3 nm to about 300 nm, and each layer having a low refractive index in the second optical filter layer may have a thickness of about 3 nm to about 300 nm. A total thickness of the second optical filter layer may be, for example, from about 3 nm to about 10,000 nm, about 300 nm to about 10,000 nm, or about 1,000 nm to about 10,000 nm. Each of the layer having a high refractive index and the layer having a low refractive index in the second optical filter layer may have the same thickness and materials or different thickness and materials from each other.

The second optical filter layer may reflect at least a portion of the first light (R) and the second light (G) and transmits at least a portion (e.g., whole part) of the third light (B). For example, the second optical filter layer 311 may transmit only the third light (B) in a blue light wavelength region of less than or equal to about 500 nm and light in a wavelength region of greater than about 500 nm, that is, green light (G), yellow light, red light (R), and the like may be not passed through the second optical filter layer and reflected. Thus the reflected green light and red light may pass through the first and the second sections to be emitted to the outside of the display device.

The second optical filter layer may reflect light in a wavelength region of greater than about 500 nm in greater than or equal to about 70%, greater than or equal to about 80%, or greater than or equal to about 90%, or even about 100%.

Meanwhile, the second optical filter layer may have a transmittance to light in a wavelength region of less than or equal to about 500 nm of, for example, greater than or equal to about 90%, greater than or equal to about 92%, greater than or equal to about 94%, greater than or equal to about 96%, greater than or equal to about 98%, greater than or equal to about 99%, or even about 100%.

In an embodiment, the aforementioned stacked structure may be produced by a method using the photoresist composition. The method may include forming a film of the composition on a substrate;
exposing a selected region of the film to light (e.g., a wavelength of less than or equal to about 400 nm); and
developing the exposed film with an alkali developing solution to obtain a pattern of the quantum dot polymer composite.

Figure 5:
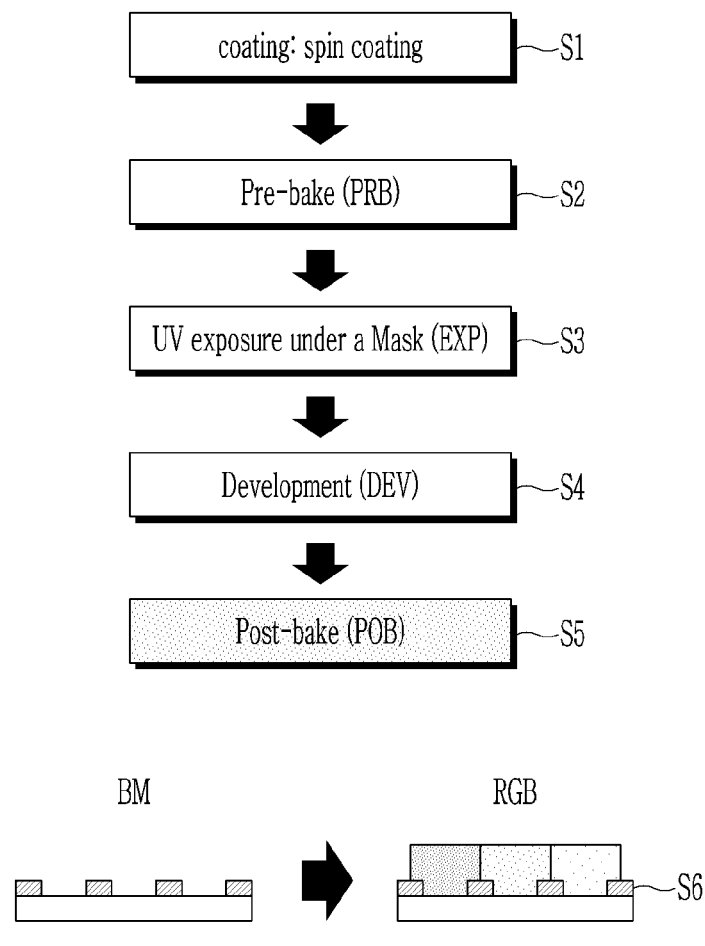
FIG. 5 schematically shows a pattern forming process using the composition according to an embodiment.

The substrate and the composition are the same as described herein. Non-limiting methods of forming the aforementioned pattern are illustrated, referring to FIG. 5.

The composition is coated to have a predetermined thickness on a substrate in an appropriate method of spin coating, slit coating, and the like (S1). The formed film may be, optionally, pre-baked (PRB) (S2). The pre-baking may be performed by selecting an appropriate condition from conditions of a temperature, time, an atmosphere, and the like.

The formed (or optionally pre-baked) film is exposed to light having a predetermined wavelength under a mask having a predetermined pattern (S3). A wavelength and intensity of the light may be selected taking into consideration types and amounts of the photoinitiator, types and amounts of the quantum dots, and the like.

The exposed film is treated with an alkali developing solution (e.g., dipping or spraying) to dissolve an unexposed region and obtain a desired pattern (S4). The obtained pattern may be, optionally, post-baked (POB) to improve crack resistance and solvent resistance of the pattern, for example, at about 150° C. to about 230° C. for a predetermined time (e.g., greater than or equal to about 10 minutes or greater than or equal to about 20 minutes) (S5).

When the quantum dot-polymer composite pattern has a plurality of repeating sections, a quantum dot-polymer composite having a desired pattern may be obtained by preparing a plurality of compositions including a quantum dot having desired photoluminescence properties (a photoluminescence peak wavelength and the like) to form each repeating section (e.g., a red light emitting quantum dot, a green light emitting quantum dot, or optionally, a blue light emitting quantum dot) and repeating (e.g., twice or more or three times or more) the aforementioned formation process of the pattern for each composition (S6). For example, the quantum dot-polymer composite may have a pattern of at least two repetitive color sections (e.g., RGB color sections). The quantum dot-polymer composite pattern may be used as a photoluminescence-type color filter in a display device.

In an embodiment, the aforementioned stacked structure may be produced using an ink composition. The method may include depositing the composition on the desirable substrate (e.g., in order to provide a desirable pattern) using an appropriate system (e.g., droplet discharging device such as inkjet or nozzle printing device) and heating the same to remove a solvent and to perform a polymerization. The method may provide a highly precise quantum dot-polymer composite film or pattern in a simple way for a short time.

An embodiment provides an electronic device including the quantum dot. The device may include a light emitting diode (LED), an organic light emitting diode (OLED), a sensor, a solar cell, an imaging sensor, or a liquid crystal display (LCD), but is not limited thereto.

Hereinafter, the embodiments are illustrated in more detail with reference to examples. However, they are exemplary embodiments of the present invention, and the present invention is not limited thereto.

EXAMPLES

Analysis Methods
1. Ultraviolet-Visible (UV-Vis) Absorption Spectroscopy

A UV Vis absorption spectroscopy is performed, and a UV-Visible absorption spectrum is obtained by using an Agilent Cary 5000 spectrophotometer.

2. Photoluminescence (PL) Analysis

A photoluminescence (PL) spectrum of a produced quantum dot at an excitation wavelength of 450 nanometers (nm) is obtained using a Hitachi F-7000 spectrophotometer.

3. Inductively Coupled Plasma-Atomic Emission Spectroscopy (ICP-AES)

An inductively coupled plasma-atomic emission spectroscopy (ICP-AES) is performed using Shimadzu ICPS-8100.

4. Ion Chromatography Analysis (IC)

Ion chromatography analysis (IC) is performed using Dionex ICS5000 (manufactured by Thermo Scientific).

Example 1

1. Synthesis of Template:

Selenium is dispersed in trioctylphosphine (TOP) to obtain a Se/TOP stock solution. To a 300 milliliter (mL) reaction flask including trioctylamine (TOA), an organic ligand including oleic acid is added and then, heated at 120° C. under vacuum. After about 1 hour, an atmosphere in the reaction flask is converted into inert gas. While the temperature of the reaction flask is increased up to 300° C., diethylzinc, diphenylphosphine oxide, and the Se/TOP stock solution are injected thereinto. After completing the injection, a reaction is performed for 40 minutes.

When the reaction is complete, ethanol is added to the reaction solution, which is rapidly cooled to room temperature, and a precipitate obtained by centrifuging the mixture is dispersed in toluene to obtain a toluene dispersion of ZnSe template nanoparticles. An average size of the template is about 3 nm.

An amount of each of the Zn precursor and Se precursor used herein is 0.9 millimoles (mmole) and 0.45 mmole.

2. Formation of Quantum Well Layer

An organic ligand including oleic acid is added to a 300 mL reaction flask including octadecene (ODE) and vacuum-treated at 120° C.

The reaction flask is internally substituted with nitrogen ($N_2$). While raising the temperature of the reactor to the reaction temperature of 300° C., toluene dispersion of the ZnSe template nanoparticles prepared in the reaction flask is rapidly added, an octadecene solution of indium palmitate is injected, and then an octadecene solution of TMSP is injected. Then, a sodium chloride solution is injected and the reaction is performed for a predetermined period of time to form a quantum well layer on the template.

After the reaction is complete, ethanol is added to the reaction solution, which is rapidly cooled to room temperature, and the precipitate obtained by centrifugation is dispersed in toluene to obtain nanoparticles having a quantum well layer formed on the template. The obtained particles have an average size of about 3.6 nm.

An amount of each of the indium precursor and phosphorus precursor used herein is 0.13 mmole and 0.13 mmole, and the amount of the sodium chloride is 0.1 mole with respect to 1 mole of In.

IC analysis is performed on the prepared particles. As a result, it is confirmed that the Na content is 15.86 parts per million (ppm) by mole and the Cl content is 28.57 ppm by mole.

3. Formation of Shell Layer

Zinc acetate along with oleic acid is added to a 300 mL reaction flask including TOA and then, vacuum-treated at 120° C. The reaction flask is internally substituted with nitrogen ($N_2$). During heating the reactor until the reaction temperature (320° C.), a toluene dispersion of the particle formed with the quantum well layer is promptly input into the reaction flask and subsequently added with Se/TOP stock solution and reacted for 30 minutes to provide a ZnSe/quantum well/ZnSe shell layer on the particle formed with the quantum well layer. Then the S/TOP stock solution is added together with zinc acetate and reacted for 30 minutes to further provide a ZnS layer.

After completing the reaction, ethanol is added into the reaction solution which has been promptly cooled at a room temperature and centrifuged to provide a precipitate, and the precipitate is dispersed in toluene to provide a toluene dispersion of quantum dots having a ZnSe/quantum well/ZnSe/ZnS shell structure. The obtained quantum dots have an average size of about 6.6 nm (standard deviation: 17%).

A mole ratio (Zn:S) of the Zn precursor and the S precursor is about 1:2, and the mole ratio of the Zn precursor used in the template: the Zn precursor used in the shell (ZnSe, ZnS) is about 1:3.

4. Analysis

Figure 6:
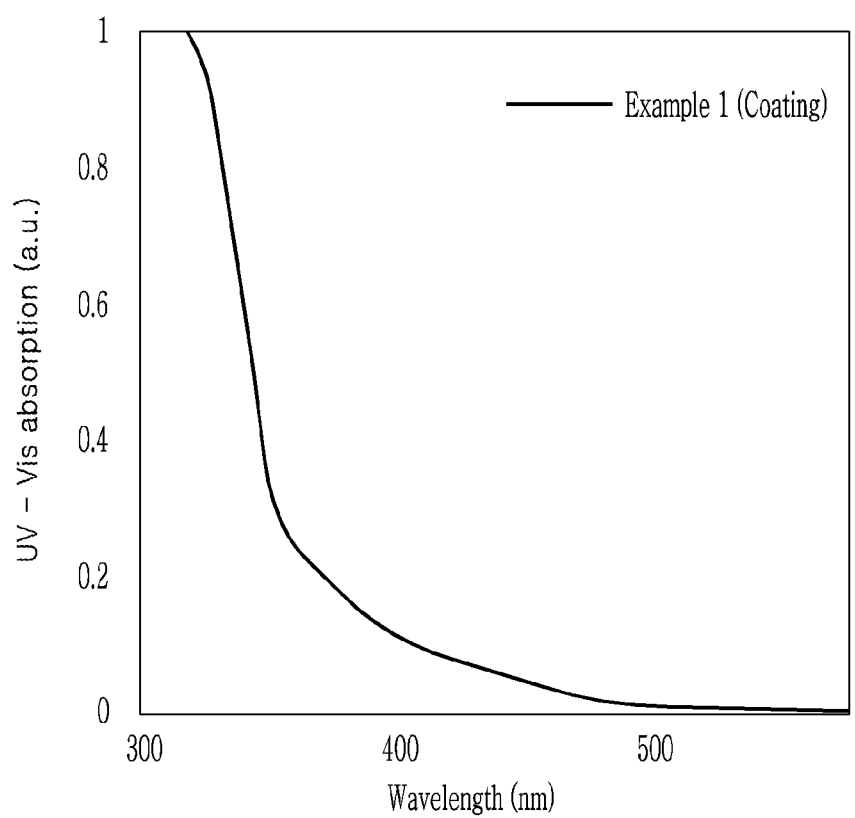
FIG. 6 is a graph of UV-Vis absorption (arbitrary units (a.u.)) versus wavelength (nm) showing the results of UV-Vis spectroscopic analysis of quantum dots prepared in Example 1.

Photoluminescence analysis and UV-Vis absorption spectroscopy are performed on the obtained quantum dots, and the results are shown in FIG. 6 and Table 1.

The ICP data of the obtained quantum dots are shown in Table 1.

TABLE 1

| ICP | Mole ratio | | | | | |
|---|---|---|---|---|---|---|
| | P:In | S:In | Zn:In | Se:In | In:In | Na:In |
| Composition | 1.13:1 | 2.96:1 | 21.29:1 | 15.25:1 | 1.00:1 | 0.02:1 |

Comparative Example 1

1. Quantum dots having the ZnSe/quantum well/ZnSe/ZnS shell structure are synthesized in accordance with the same procedure as in Example 1, except that sodium chloride and $H_2O$ are not injected during forming the quantum well. The obtained quantum dots have an average size of about 6.7 nm.

2. Analysis

Photoluminescence analysis and UV-Vis absorption spectroscopy are performed on the obtained quantum dots. The results are shown in Table 2.

TABLE 2

| | PL (nm) | Relative Quantum Efficiency (QY) (%) with respect to Comparative Example 1 |
|---|---|---|
| Example 1 | 542 | 115 |
| Comparative Example 1 | 552 | 100 |

As shown in UV-Vis absorption spectroscopy, it is confirmed that quantum dots of Example 1 have no inflection point (point of changing concave to convex) within the wavelength range of about 450 nm to about 620 nm.

Reviewing the photoluminescence analysis, it is confirmed that the emission wavelength of the quantum dots obtained from Example 1 is shifted toward the short wavelength in 10 nm with respect to the quantum dots obtained from Comparative Example 1 (blue shift). In addition, it is confirmed that the luminous efficiency of quantum dots obtained from Example 1 is increased compared to quantum dots obtained from Comparative Example 1.

Example 2

1. Quantum dots having a ZnSe/quantum well/ZnSe/ZnS shell structure are synthesized in accordance with the same procedure as in Example 1, except that the contents of the indium precursor and the phosphorus precursor content are 0.17 mmole and 0.16 mmole, respectively.

2. Analysis

Photoluminescence analysis is performed on the produced quantum dots, and the results are shown in Table 3.

Comparative Example 2

Quantum dots having a ZnSe/quantum well/ZnSe/ZnS shell structure are synthesized in accordance with the same procedure as in Example 2, except that sodium chloride is not injected during forming a quantum well.

Photoluminescence analysis is performed on the produced quantum dots, and the results are shown in Table 3.

Comparative Example 3

1. Quantum dots having a ZnSe/quantum well/ZnSe/ZnS shell structure are synthesized in accordance with the same procedure as in Example 2, except that an acetone solution of sodium oleate is injected instead of the sodium chloride during forming a quantum well.
2. Analysis Photoluminescence analysis is performed on the produced quantum dots, and the results are shown in Table 3.

TABLE 3

|  | PL (nm) | Relative QY (%) with respect to Comparative Example 2 |
| --- | --- | --- |
| Example 2 | 550 | 117 |
| Comparative Example 2 | 563 | 100 |
| Comparative Example 3 | 553 | 96 |

Reviewing the photoluminescence analysis, it is confirmed that the emission wavelength of the quantum dots obtained from Example 2 is shifted toward the short wavelength compared to the quantum dots obtained from Comparative Example 3. In addition, it is confirmed that the luminous efficiency of quantum dots obtained from Example 2 is more increased than in quantum dots obtained from Comparative Examples 3.

Comparative Example 4

1. Quantum dots having a ZnSe/quantum well/ZnSe/ZnS shell structure are synthesized is synthesized in accordance with the same procedure as in Example 2, except that an acetone solution including hydrogen chloride is injected instead of the sodium chloride solution during forming a quantum well.

The photoluminescence analysis is performed on the obtained quantum dots, and substantially no improvement in the QY is found.

While this disclosure has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

What is claimed is:

1. A quantum dot comprising
a first semiconductor nanocrystal comprising a Group II-VI compound;
a second semiconductor nanocrystal disposed on the first semiconductor nanocrystal, the second semiconductor nanocrystal comprising
at least one Group IIIA metal that is not aluminum, and
a Group V element; and
a shell comprising a third semiconductor nanocrystal disposed on the second semiconductor nanocrystal, the third semiconductor nanocrystal comprising a Group II-VI compound,
wherein the quantum dot does not comprise cadmium,
a band gap energy of the second semiconductor nanocrystal is less than a band gap energy of the first semiconductor nanocrystal,
the band gap energy of the second semiconductor nanocrystal is less than a band gap energy of the third semiconductor nanocrystal, and
the quantum dot further comprises an additional metal comprising an alkali metal, an alkaline earth metal, aluminum, iron, cobalt, nickel, copper, or a combination thereof.

2. The quantum dot of claim 1, wherein the additional metal comprises lithium, sodium, aluminum, or a combination thereof.

3. The quantum dot of claim 1, wherein the additional metal comprises magnesium.

4. The quantum dot of claim 1, wherein the Group II-VI compound in the first semiconductor nanocrystal comprises a zinc chalcogenide, and the Group II-VI compound in the third semiconductor nanocrystal comprises a zinc chalcogenide.

5. The quantum dot of claim 1, wherein the first semiconductor nanocrystal comprises ZnSe, ZnTeSe, ZnSeS, ZnS, or a combination thereof, and the third semiconductor nanocrystal comprises ZnSe, ZnSeS, ZnS, or a combination thereof.

6. The quantum dot of claim 5, wherein in the quantum dot, a total mole amount of indium and phosphorus is less than about 20%, based on a total number of moles in the quantum dot.

7. The quantum dot of claim 5, wherein the first semiconductor nanocrystal comprises zinc and selenium and the shell comprises zinc, selenium, and sulfur, and
in the quantum dot, a mole ratio of zinc with respect to a total sum of selenium and sulfur is greater than or equal to about 1:1.

8. The quantum dot of claim 5, wherein the second semiconductor nanocrystal comprises a plurality of layers, and a composition of a first layer among the plurality of layers is different than a composition of a second layer among the plurality of layers, the first layer being adjacent to the second layer.

9. The quantum dot of claim 1, wherein the second semiconductor nanocrystal comprises indium and phosphorus.

10. The quantum dot of claim 1, wherein an ultraviolet-visible absorption spectrum curve of the quantum dot does not have an inflection point within a wavelength range of about 450 nanometers to about 620 nanometers.

11. The quantum dot of claim 1, wherein the quantum dot comprises an organic ligand on a surface of the quantum dot,
wherein the organic ligand comprises RCOOH, RCOOCOR, $RNH_2$, $R_2NH$, $R_3N$, RSH, $R_3PO$, $R_3P$, ROH, RCOOR', $RPO(OH)_2$, $R_2POOH$, or a combination thereof, wherein R and R' are each independently a substituted or substituted C1 to C30 aliphatic hydrocarbon group, a substituted or unsubstituted C6 to C30 aromatic hydrocarbon group, or a combination thereof.

12. The quantum dot of claim 1, wherein
the quantum dot emits green light, and
an ultraviolet-visible absorption spectrum curve of the quantum dot does not have an inflection point within the wavelength range of about 450 nanometers to about 540 nanometers.

13. A quantum dot comprising
a first semiconductor nanocrystal comprising a Group II-VI compound;
a second semiconductor nanocrystal disposed on the first semiconductor nanocrystal, the second semiconductor nanocrystal comprising
at least one Group IIIA metal that is not aluminum, and a Group V element; and
a shell comprising a third semiconductor nanocrystal disposed on the second semiconductor nanocrystal, the third semiconductor nanocrystal comprising a Group II-VI compound,
wherein the quantum dot does not comprise cadmium,
a band gap energy of the second semiconductor nanocrystal is less than a band gap energy of the first semiconductor nanocrystal,
the band gap energy of the second semiconductor nanocrystal is less than a band gap energy of the third semiconductor nanocrystal, and
the quantum dot further comprises an additional metal comprising an alkali metal, an alkaline earth metal, aluminum, iron, cobalt, nickel, copper, zinc, or a combination thereof; and
a halogen,
wherein the halogen is fluorine, chlorine, or a combination thereof.

14. The quantum dot of claim 13, wherein the additional metal and the halogen are present at an interface between the first semiconductor nanocrystal and the second semiconductor nanocrystal, inside the second semiconductor nanocrystal, an interface between the second semiconductor nanocrystal and the shell, or a combination thereof.

15. The quantum dot of claim 13, wherein the quantum dot exhibits increased quantum efficiency and an emission wavelength that is shifted toward a short wavelength with respect to a quantum dot that comprises the first semiconductor nanocrystal, the second semiconductor nanocrystal, and the shell, but does not comprise the additional metal or the halogen.

16. A quantum dot comprising
a first semiconductor nanocrystal comprising a Group II-VI compound;
a second semiconductor nanocrystal disposed on the first semiconductor nanocrystal, the second semiconductor nanocrystal comprising
at least one Group IIIA metal that is not aluminum, and a Group V element; and
a shell comprising a third semiconductor nanocrystal disposed on the second semiconductor nanocrystal, the third semiconductor nanocrystal comprising a Group II-VI compound,
wherein the quantum dot does not comprise cadmium,
a band gap energy of the second semiconductor nanocrystal is less than a band gap energy of the first semiconductor nanocrystal,
the band gap energy of the second semiconductor nanocrystal is less than a band gap energy of the third semiconductor nanocrystal, and
the quantum dot comprises an additional metal comprising an alkali metal, an alkaline earth metal, aluminum, iron, cobalt, nickel, copper, zinc, or a combination thereof, and
wherein a composition of the first semiconductor nanocrystal is different than a composition of the third semiconductor nanocrystal.

17. A composition comprising
the quantum dot of claim 1,
a dispersing agent,
a polymerizable monomer comprising a carbon-carbon unsaturated bond,
an initiator, and
a solvent.

18. The composition of claim 17, wherein
the dispersing agent is a polymer comprising a carboxylic acid group, and
wherein the polymer comprises
a copolymer of a monomer combination comprising a first monomer comprising a carboxylic acid group and a carbon-carbon double bond, a second monomer comprising a carbon-carbon double bond and a hydrophobic moiety and not comprising a carboxylic acid group, and optionally a third monomer comprising a carbon-carbon double bond and a hydrophilic moiety and not comprising a carboxylic acid group;
a polymer comprising a multi-aromatic ring comprising a carboxylic acid group and having a backbone structure in which two aromatic rings in the main chain are bonded to a quaternary carbon atom that is a constituent atom of another cyclic moiety; or
a combination thereof.

19. The composition of claim 17, wherein the composition further comprises a multi-thiol compound having at least two thiol groups at a terminal end of the multi-thiol compound, a metal oxide particulate, or a combination thereof.

20. A patterned film comprising
a repeating section configured to emit light in a predetermined wavelength,
wherein the repeating section comprises a quantum dot polymer composite, and
the quantum dot-polymer composite comprises a polymer matrix and the quantum dot of claim 1 dispersed in the polymer matrix.

21. The patterned film of claim 20, wherein the repeating section comprises a first section configured to emit red light, a second section configured to emit green light, or a combination thereof.

22. A display device comprising
a light source; and
a photoluminescence element,
wherein the photoluminescence element comprises
a substrate, and
the patterned film of claim 20 disposed on a surface of the substrate, and
the light source is configured to provide the photoluminescence element with incident light.

23. The display device of claim 22, wherein the incident light has a photoluminescence peak wavelength of about 440 nanometers to about 460 nanometers.

* * * * *